United States Patent [19]

Sachs

[11] Patent Number: 4,627,887
[45] Date of Patent: Dec. 9, 1986

[54] MELT DUMPING IN STRING STABILIZED RIBBON GROWTH

[76] Inventor: Emanuel M. Sachs, 42 Old Middlesex Rd., Belmont, Mass. 02178

[21] Appl. No.: 439,603

[22] Filed: Nov. 5, 1982

Related U.S. Application Data

[63] Continuation of Ser. No. 214,741, Dec. 11, 1980, abandoned, Continuation-in-part of Ser. No. 109,865, Jan. 7, 1980, abandoned.

[51] Int. Cl.⁴ ............................................. C30B 15/00
[52] U.S. Cl. ................................................. 156/608
[58] Field of Search ................. 156/617 SP, 608, 602, 156/DIG. 64; 422/247, 249; 432/263-265

[56] References Cited

U.S. PATENT DOCUMENTS

| | | | |
|---|---|---|---|
| 2,727,839 | 12/1955 | Sparks | 156/617 SP |
| 2,727,840 | 12/1955 | Teal | 156/617 SP |
| 3,582,528 | 6/1971 | Seale et al. | 156/617 SP |

Primary Examiner—Hiram H. Bernstein
Attorney, Agent, or Firm—Weingarten, Schurgin, Gagnebin & Hayes

[57] ABSTRACT

A method and apparatus for stabilizing the edge positions of a ribbon drawn from a melt includes the use of wettable strings drawn in parallel up through the melt surface, the ribbon being grown between the strings. A furnace and various features of the crucible used therein permit continuous automatic growth of flat ribbons without close temperature control or the need for visual inspection.

8 Claims, 47 Drawing Figures

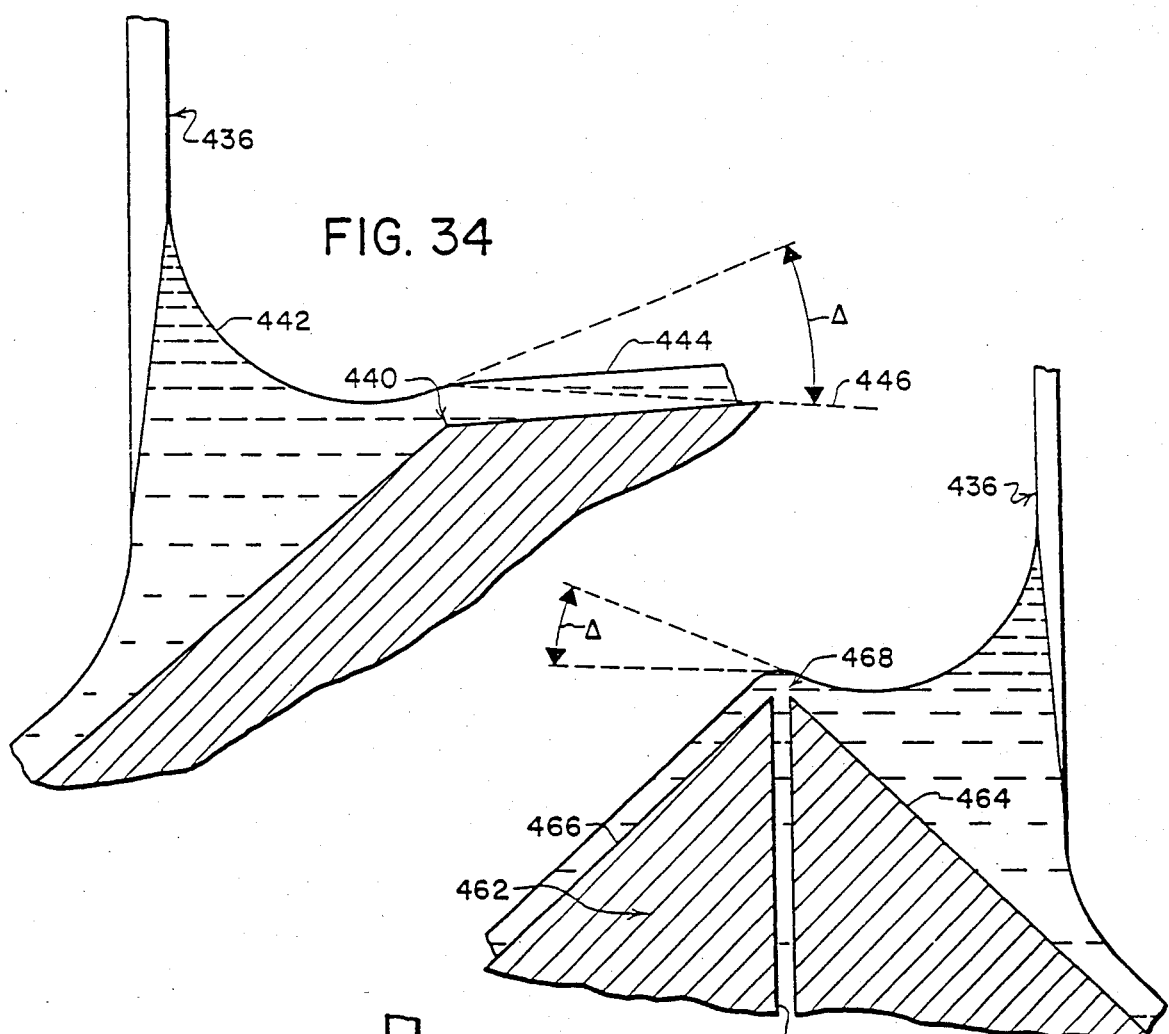
FIG. 34
FIG. 35
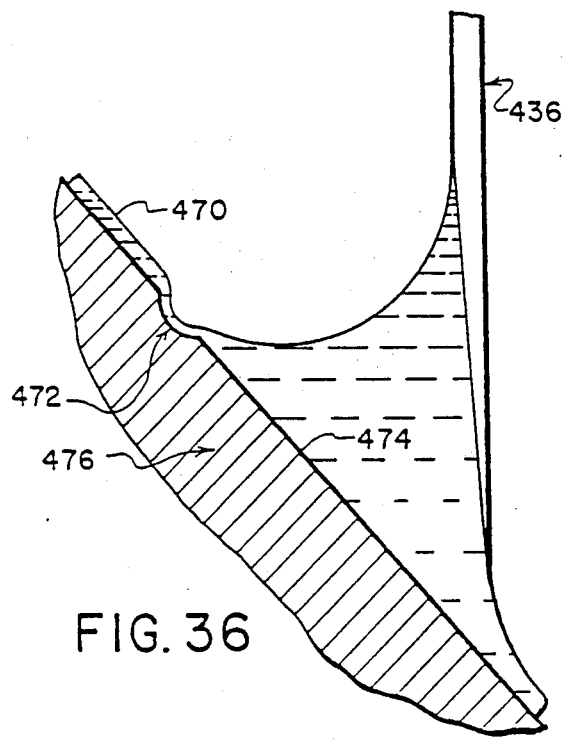
FIG. 36
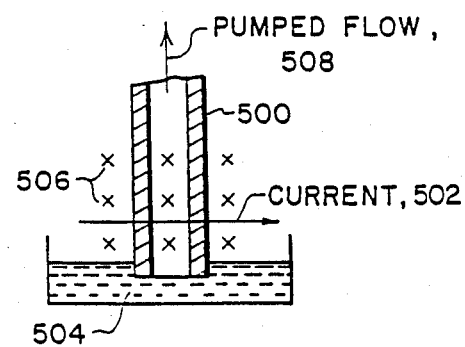
FIG. 37

4,627,887

MELT DUMPING IN STRING STABILIZED RIBBON GROWTH

RELATED APPLICATION

This is a continuation of application Ser. No. 214,741, filed Dec. 11, 1980, now abandoned, which is a continuation-in-part of application Ser. No. 109,865 filed Jan. 7, 1980, now abandoned, which application was entitled "String Stabilized Ribbon Growth.

FIELD OF THE INVENTION

This invention relates to the continuous growth of crystalline bodies from a melt, and more particularly to a system for automatic string-stabilized ribbon growth.

BACKGROUND

One of the most important applications for crystal growing is in the area of semiconductor substrate material. This substrate material is available in ribbon form in which ribbons of large-grain polycrystalline or single crystalline material are grown. The ribbons, usually of silicon, have wide application in the semiconductor industry and are especially well adapted for use as solar cell substrates.

Several processes are described in the literature for the growth of crystalline ribbon from melt. In one process capillary action is used to feed molten material up through a die which is used to shape the growing ribbon. In order to exercise control over this process it is necessary to control the heat removal from the ribbon surface, the pulling speed, the average die temperature, and the precise temperature distribution along the entire die, most specifically at the edges. This process suffers principally from a lack of growth stability since the position of the edges of the ribbon are difficult to control and the ribbon often "freezes" to the die when the die temperature or some other growth variable momentarily fluctuates.

An additional problem encountered with this technique is that all the material flowing up through the die is incorporated into the solidified ribbon. Since this material includes impurities, unacceptable impurity levels can exist in the solidified ribbon. In contrast, when pulling a ribbon directly from a melt impurities tend to become segregated at the interface between the melt and the solidified ribbon, such that the impurities are rejected back into the melt and do not become incorporated into the solidified ribbon. Since the use of a die partially prevents such segregation of impurities, pulling a ribbon directly from a melt is a prerferred process.

U.S. Pat. No. 3,129,061 described another process for ribbon growth which is referred to as the web dendritic growth process. In this process dendrites, which are of the same materials as the ribbon, are grown into a melt supercooled at the ribbon edges in order to stabilize the ribbon edge position. The principal problem associated with this technique is the high degree of temperature control needed to maintain dendritic growth at the ribbon edges while maintaining conventional growth along the ribbon "web". (See also "Thermal Analysis of Solidification in Web-Dendritic Ribbon Growth", by Harrill, Rhodes, Faust, and Hilborn, *Journal of Crystal Growth*, Vol. 44; pps. 34-44, 1978). Other web dendritic techniques are illustrated in U.S. Pat. Nos. 3,298,795; 3,031,403; and 3,370,927. The last of these patents is directed to the angular pulling of continuous dendritic crystals.

By way of further background, a technique for growing a matrix structure of silicon is illustrated in an article by Theodore F. Ciszek and Guenter H. Schwuttke, entitled "Inexpensive Silicon Sheets for Solar Cells", NASA Tech Briefs, Winter 1977, pps. 432-433. In this technique a graphite screen is dipped into a liquid silicon bath and is then pulled from the bath. This produces a patterned sheet or film of liquid silicon which solidifies in the screen to produce a textured semicrystalline composite. It will be appreciated that the technique described by Ciszek, et al is not a crystal growing technique because silicon is first captured by capillary action in the graphite screen and is then held until such time as it solidifies. This differs from the growth of ribbon from a melt in which crystallization takes place at the face of the melt as the ribbon is withdrawn. In ribbon growth, grain boundaries generally exist perpendicular to the plane of the ribbon, while the Ciszek, et al technique generally produces randomly oriented grain boundaries which act as random carrier traps for impurities, resulting in devices which are less uniform in performance. The Ciszek et al technique also results in undesirably small grain sizes and in a non-uniform central web which is encumbered by the grid structure. Because of the use of the grid, the product of Ciszek, et al is not a flat sheet, and if the grid embedded in the semiconductor ribbon is not very precisely placed, shorting of p-n junctions created by diffusion can occur.

With respect to prior art crystal growing furnaces, reference is made to U.S. Pat. Nos. 3,639,718 and 3,865,554. Both of these patents describe furnaces suitable for batch-type crystal growth using the Czochralski method. These furnaces are adapted for processes requiring critical monitoring during crystal pulling and are not designed or adapted for continuous ribbon growth. More specifically, these furnaces are designed to carry out crystal growing with temperatures maintained to ±0.1° C., with visual inspection and automatic control being a prerequisite for obtaining uniform crystal properties.

SUMMARY OF THE INVENTION

In the present invention, a ribbon with an unobstructed central web is grown directly from the melt, with edge positions determined and stabilized by wetted strings or strands moving continuously in parallel up through the melt. During the ribbon drawing process, the strands are frozen into the growing ribbon. These strands, unlike dendrites, are of a material different from the melt. For example in the growth of silicon ribbons, graphite, carbon, silicon carbide or quartz strings are preferred, and are preferably wetted by the melt. It will be appreciated that the above mentioned strings span a range of wettabilities such that the amount of material attaching to the strings can vary while nonetheless resulting in a string frozen into the ribbon.

In this string stabilized growth (SSG) process, the shape of a surface tension controlled meniscus is defined on the bottom by the melt, on the top by the interface with the growing crystal, and at the edges by the wetted strings. The parameters that must be controlled in the process are pulling speed, rate of heat removal from ribbon surfaces, and average melt temperature. Due to the capillary induced edge definition, it is not necessary to maintain precise control of the temperature of the melt at the ribbon edges vis-a-vis the ribbon center.

In accordance with this invention string stabilized ribbons may be grown over a wide range of angles relative to the melt surface. Growth at a relatively low angle to the melt has the primary advantage of increasing the area of the solidification interface, thereby increasing the maximum possible growth speed.

Continuous introduction of the string to the melt may be accomplished by a number of techniques. In one embodiment, a crucible is provided having small apertures in its bottom and through which the strings are introduced, with the surface tension of the melt usually being sufficient to counteract the gravitational head to retain the molten material in the crucible and prevent leakage through the apertures. Gravitationally produced leakage can alternatively be prevented by gas pressure or by electromagnetic forces utilized to balance the gravitational head of the liquid.

The transference of impurities from the strings into the melt is controlled either by minimizing the time during which the strings are immersed in the melt or by freezing the melt around the strings as they enter the melt, thereby freezing in impurities and confining them to the areas occupied by the strings. The freezing technique can be accomplished by passage of an electrical current through the strings, across the interface between the string and the melt, and through the melt to form a Peltier or thermoelectric junction between the string and the melt to achieve localized Peltier cooling.

Unlike ribbon forming systems which utilize a die, when pulling a ribbon directly from a melt, a substantial portion of the impurities within the melt are rejected back into the melt during the solidification process because they are frozen out of the ribbon as the ribbon solidifies at the melt-ribbon interface. In a non-replenished system, should this occur for any length of time, the concentration of impurities within the melt increases.

As part of the invention, the impurity concentration of the melt at the crystal growing site is minimized by electromagnetic stirring and melt dumping to reduce the impurity concentration in the ribbon. In one embodiment, minimizing the amount of impurities introduced from the melt into the ribbon is achieved by maintaining a constant flow of melt perpendicular to the plane of the growing ribbon. This permits convection and diffusion to carry away the impurities that are rejected at the growth interface. Additionally, because of the segregation of impurities at the growth interface which concentrates the impurities in the melt as opposed to the ribbon, continuous melt flushing or dumping is effective to reduce impurity concentration in the ribbon. Flushing off a portion of the melt reduces the impurity concentration in the melt within the crucible and thus results in a lower impurity concentration in the solidified ribbon.

An improved furnace is provided for automatic continuous ribbon growth in which close temperature control or visual inspection is not necessary, and in which temperature variations of as much as 10° C. can be tolerated. The furnace is provided with a crucible supported by posts, selected opposing posts being provided with pins adapted to fit into radially extending slots in the bottom of the crucible for accommodating thermal expansion and contraction of the crucible while maintaining angular position. A centrally located positioning tube is provided for locating the center of the crucible within the furnace. In one embodiment, a thermocouple is conveniently disposed in one end of the positioning tube for crucible temperature monitoring.

Heater rods are mounted through the base of the crucible for more efficient and controllable energy transfer to the melt than is possible with conventional heating elements which surround the crucible. In one embodiment, the heater rod ends are in sliding fit engagement with electrical contact blocks positioned on either side of the crucible, with the sliding fit accommodating thermal expansion and contraction of the rods. Moreover, non-uniformities in the temperature profile of the melt can be corrected by changing the size and shape of individual heater rods.

String introduction tubes are provided at the string introduction points in the bottom of the crucible to prevent by capillary action, any melt leakage at these points. In order to prevent freezing of the molten material within a tube, the tube is recessed within the crucible such that the bottom portion of the crucible surrounds the tube, with heating provided by radiative transfer from the surrounding crucible walls. String positioning or guide tubes are disposed below the crucible in alignment with the string introduction tubes to facilitate string introduction.

A melt flushing tube is provided to permit controlled removal or flushing of molten material as the melt is replenished. Such removal is controlled in one embodiment by selective freezing and thawing of the melt in the tubes; in another embodiment by capillary action; and in a further embodiment by controlled suction.

The flatness of the ribbon can be maintained for angled growth by a straight-edged wetted stabilization within the melt which acts to control the meniscus shape to prevent curvature or bowing of the ribbon. In an inclined surface embodiment in which strings are pulled vertically through an inclined surface down which pumped melt is flowing, an abrupt change in melt flow direction is provided to prevent curvature or bowing of the ribbon. The melt is pumped to the top of the inclined surface in one embodiment by electromagnetic pumping.

BRIEF DESCRIPTION OF THE DRAWINGS

The present invention is more fully set forth below in the following detailed description and in the accompanying drawings, in which:

FIG. 34 is a cross-sectional and diagrammatic illustration of a portion of FIG. 33 showing the region around the flow discontinuity;

FIGS. 35 and 36 are cross-sectional and diagrammatic illustrations of two alternative methods of forming flow discontinuities for the inclined surface growth technique of FIGS. 31 and 32; and, FIG. 37 is a diagrammatic illustration of an electromagnetic melt pumping technique for use in the method of FIG. 31.

DETAILED DESCRIPTION

Figure 1:
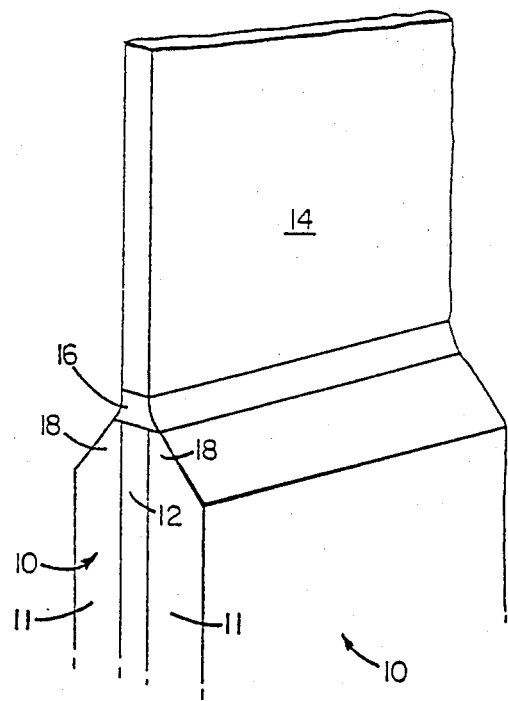
FIG. 1 is a diagrammatic illustration of a prior art ribbon growth process in which a die is used to feed molten material up from a melt.

FIG. 1 illustrates the prior art process for the growth of crystalline ribbon utilizing a die 10, formed of spaced members 11 defining between them a capillary filled slot 12. Surface tension forces advance molten material up through slot 12 and a ribbon 14 is built up at a meniscus 16 at the outlet 18 of the die. In this process of building up a ribbon, a number of parameters must be controlled so that the ribbon is formed uniformly. Moreover, further drawbacks in the utilization of a die include the difficulty in attaining growth stability due to edge position dislocation and the inability to concentrate impurities in the melt as the ribbon is formed.

Figure 2:
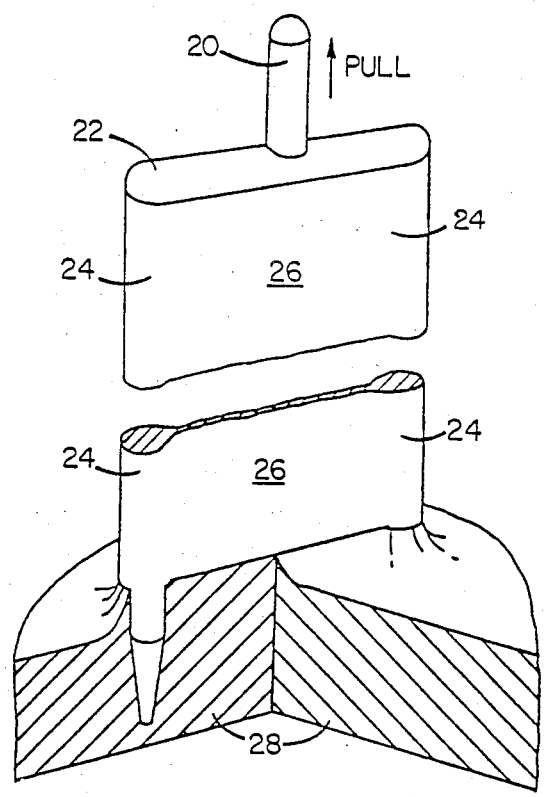
FIG. 2 is a diagrammatic illustration of a prior art web-dendritic growth process.

Referring now to FIG. 2, edge stability has been promoted in the past through the utilization of dendrites which are grown from a seed 20 which has a laterally extending portion 22. Using suitable growing conditions, edge dendrites 24 are formed with a central web 26 extending therebetween. Lateral growth begins when the seed is dipped into a melt 28 which is supercooled at the positions when the dendrites are to be grown. In one embodiment the melt consists of liquid silicon. When pulling commences, the two coplanar dendrites grow downward into the melt from the ends of the seed. The melt is pulled up between the dendrites by surface tension to form the web. Solidification in the web occurs above the melt surface while the dendrites grow below the surface, with the growth of the dendrites requiring the melt to be supercooled at the ribbon edges. As mentioned hereinbefore, the principal problem associated with this technique is the high degree of temperature control needed to maintain dendrite growth at the ribbon edges while maintaining conventional growth along the ribbon web.

Figure 3:
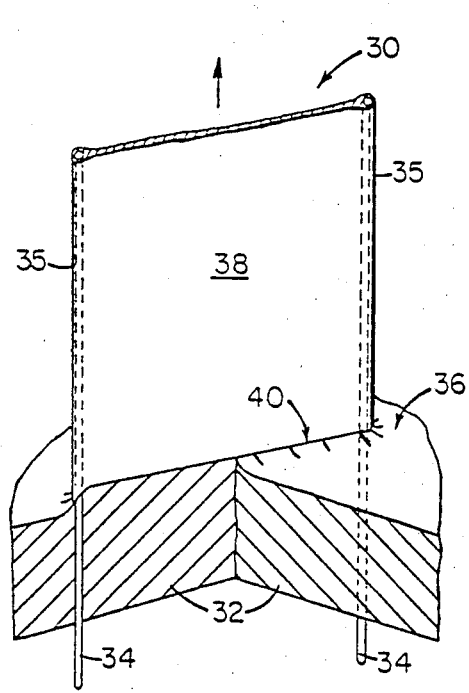
FIG. 3 is a diagrammatic illustration of one embodiment of the subject invention, in which edge definition is a result of the use of wetted strings or strands.

In contradistinction to the prior art techniques of FIGS. 1 and 2, the subject invention provides, as shown in FIG. 3, a thin, relatively wide crystalline body 30 grown directly from a melt 32 of the same material, with the ribbon edges defined by wetted strings 34 pulled up through the melt. As the ribbon is formed the strings are frozen into the growing ribbon, with a thin film of melt 35 is frozen about strings 34. The central part of the ribbon is defined by the capillary shaping action of the meniscus, here illustrated at 36. The growing ribbon or web 38 is contained between the strings and solidifies at interface 40. It should be noted that while FIG. 3 illustrates a case where the diameter of the string is approximately equal to the ribbon thickness, the same technique may be used to grow ribbon the thickness of which is either greater or smaller than the diameter of the string.

Figure 4:
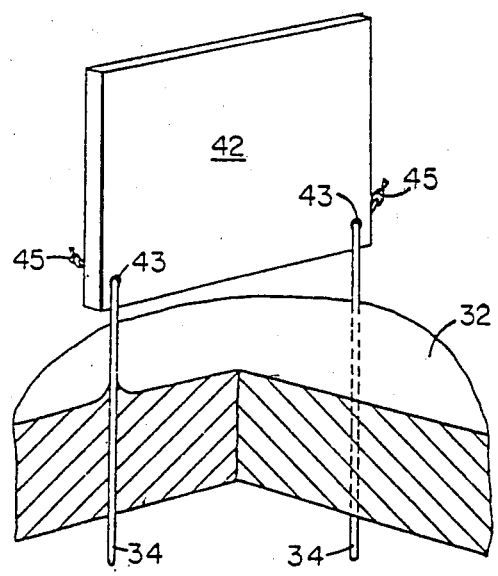
FIG. 4 is a diagrammatic illustration of the subject process illustrating the use of a seed crystal for start up.

FIG. 4 illustrates how the growth process is initiated. A seed 42 with strings 34 attached is lowered into melt 32, contact is made, and a meniscus is established. Growth is then initiated by pulling the strings and seed upward. Note, the seed/string unit may include a piece of previously grown ribbon.

The growth of the crystalline ribbon itself will now be explained in detail. The growth of a thin sheet directly from the melt is controlled by a combination of geometrical and thermal constraints, as explained below. The geometrical constraints are dictated by the meniscus geometry. The local radius of curvature of the meniscus along the face of the ribbon is determined by a balance of the gravitationally induced pressure head and surface tension induced pressure drop across the liquid-gas interface. Laplace's equation applied at all points of the ribbon except near the edges yields:

$$R = \frac{\gamma}{\rho g h} \qquad \text{(Eq. 1)}$$

where R is the local radius of curvature of the meniscus in a plane perpendicular to the ribbon, $\gamma$ is the surface tension of the liquid, $\rho$ is the mass density of the liquid, g is the local acceleration of gravity, and h is the elevation of a point above the melt surface. The meniscus must join the melt surface continuously, that is, it must have zero slope at the melt surface. In addition, the meniscus must meet the growing crystal at some specific angle, this angle determined by the properties of the material being grown. For silicon, this angle is approximately 11°.

The Laplace equation and the two boundary conditions for the meniscus may be used to find an expression for the meniscus height, i.e. elevation of the interface above the melt, required for constant thickness growth. For the vertical growth of silicon:

$$\text{Meniscus Height} = 1.09\sqrt{\frac{\gamma}{\rho g}} \qquad \text{(Eq. 2)}$$

A similar expression may be found for ribbon growth of any material at any angle to the melt.

Thus, steady state, constant thickness growth requires that the meniscus establish itself at a very specific level for each growth situation. A meniscus which is higher than this value will lead to a ribbon of decreasing thickness, while a meniscus lower than this value will lead to an increasing thickness.

Whereas the meniscus determines the rate of change of the ribbon thickness, thermal considerations primarily determine the meniscus height itself. An instantaneously valid energy balance must be maintained at the interface between heat conduction up the meniscus from the melt, heat of fusion generated by the solidifying crystal at the interface and heat conducted up and through the ribbon from the interface. The heat conducted up the meniscus depends upon the temperature of the melt and the meniscus height. The heat of fusion generated depends primarily on the ribbon thickness and the growth speed, while the heat conducted up and through the ribbon depends upon the ribbon thickness and the manner of the heat removal from the ribbon surface. Thus, the requirement of an instantaneous energy balance at the interface defines a fairly complex relationship between all relevant growth variables. This relationship, in combination with the geometrical considerations discussed earlier, dictates the physics of the growth of ribbon from the melt.

The process may be shown to be stable for essentially all configurations. In steady state growth, geometrical requirements such as angles of meniscus attachment, curvature of meniscus surfaces, etc., fix the meniscus height and hence, the heat flux up the meniscus for a given melt temperature. Thus, the steady state ribbon thickness is principally fixed by an interaction of the heat of fusion generated at the interface with the heat conducted up and through the ribbon, with the system reacting in a stable manner to adjust the thickness of the ribbon being grown until the proper heat balance is attained. This discussion applies to both vertical growth of a ribbon, as well as growth at an angle to the melt.

The width of the ribbon is of course defined by the capillary attachment to the edge stabilizing strings. This surface tension attachment provides for a wide latitude of allowed temperatures at the ribbon edges, as the edge position is no longer determined primarily by thermal effects. The strings also contribute greatly to the stability of the ribbon when produced at angles to the vertical.

Figure 5A:
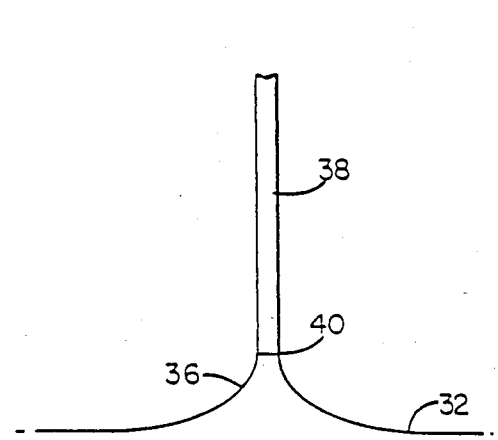
FIGS. 5A–5D are diagrammatic illustrations of crystal growth at angles to the vertical, for string supported systems.
Figure 5B:
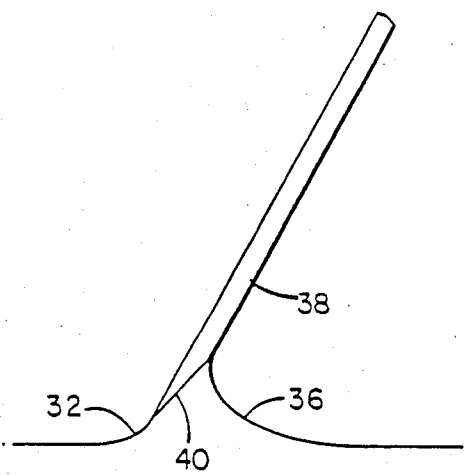
Figure 5C:
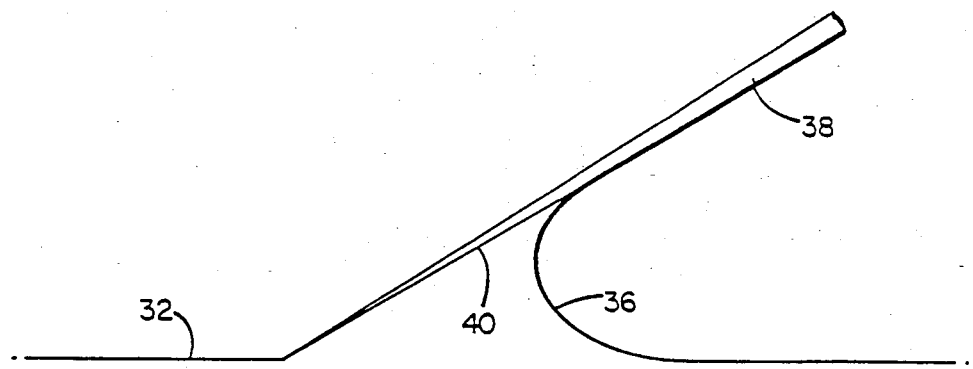
Figure 5D:
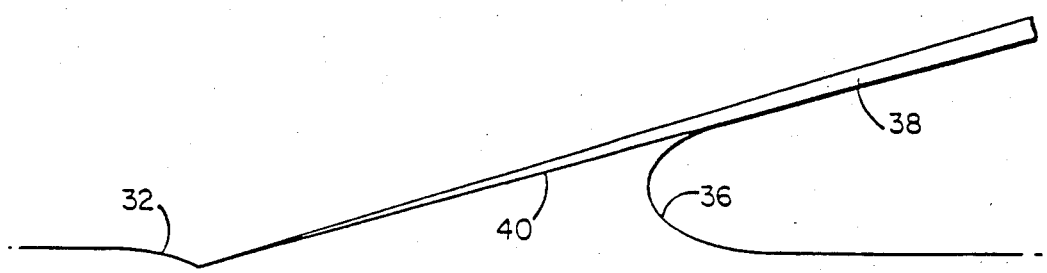

FIGS. 5A through 5D show cross sectional views of ribbon growth at various angles to the melt. These approximately scale drawings are for a material with an angle, $\phi_o$, of attachment of the meniscus to the solid of 30°. FIG. 5A shows vertical growth from the melt; FIG. 5B shows growth at 60° from the horizontal; FIG. 5C shows growth at 30° from the horizontal; and FIG. 5D shows growth at 15° from the horizontal.

These figures serve to illustrate how the boundary conditions of meniscus attachment to the growing crystal may be met while growing at any angle to the melt in steady state growth. It should be noted that while the interfaces 40 in FIGS. 5A through 5D are shown as straight lines, they need not be straight. In fact, they may assume any shape, concave up, concave down, etc., as dictated by the thermal conditions. The end points of the interface are where the triple junctions of solid, liquid and gas exist. Geometrically, the distance between these end points, in combination with the angle of growth from the melt, determines the steady state ribbon thickness being grown.

It will be appreciated that the subject string edge stabilization technique greatly enhances the ability to grow ribbon at any angle to the melt. The main advantage of pulling at an angle is increased growth speed due to increased interface area.

INTRODUCTION OF THE STRING TO THE MELT

Figure 6:
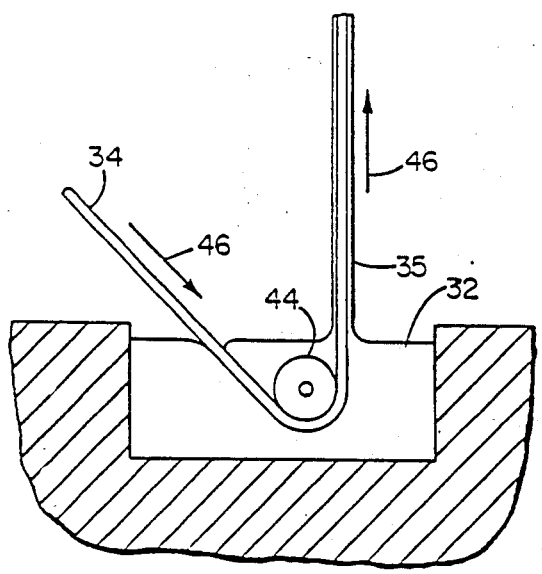
FIG. 6 is a cross-sectional illustration showing one method of string introduction in which a pulley or like direction changing device is located within the melt.

FIGS. 6 through 9 illustrate methods of introducing the edge stabilizing string to the melt. In FIG. 6 string 34 is passed around a pulley 44 which is totally submerged in melt 32. The string enters the melt, passes around the pulley and then emerges from the melt where it is incorporated into the growing ribbon. The direction of movement of the string is illustrated by arrows 46.

Figure 7:
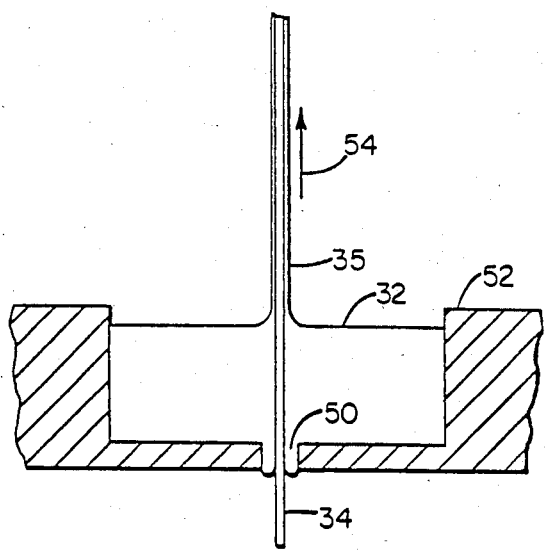
FIG. 7 is a cross-sectional illustration showing another melt of string introduction in which the string is introduced into the melt through an aperture in the bottom of the melt crucible, with melt containment via surface tension.

In FIG. 7 a relatively small string aperture 50 in the bottom of a crucible 52 accommodates the string. The gravitational pressure head of the melt is counteracted by surface tension of the melt attached to both the crucible and the string moving upwardly, as illustrated by arrow 54.

Figure 8:
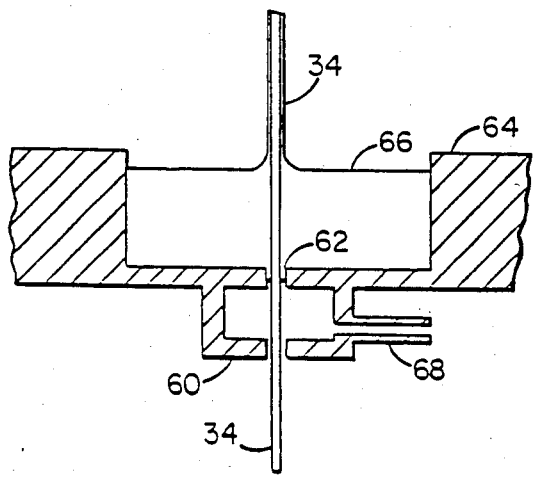
FIG. 8 is a cross-sectionable illustration of string feed and melt containment utilizing a pressurized chamber to counteract gravitational force.

In another embodiment, as illustrated in FIG. 8, a small chamber 60 is provided immediately below a string aperture 62 in a crucible 64. This chamber is pressurized with gas to counteract the gravitational head of melt 66 in the crucible. Chamber 60 has a gas inlet channel 68 communicating with a suitable pressurized gas source (not shown).

Figure 9:
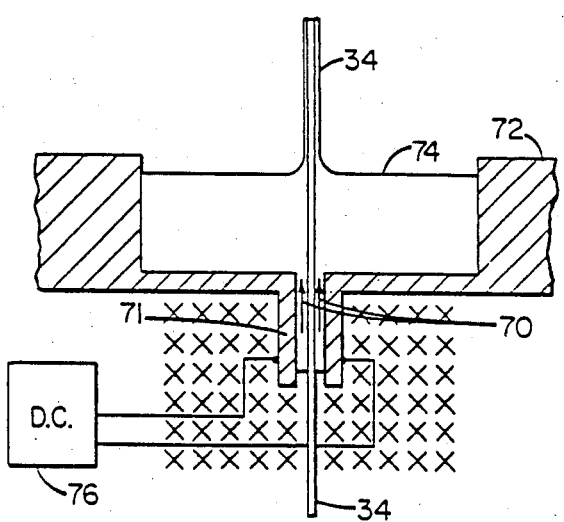
FIG. 9 is a cross-sectional illustration of string feed and melt containment utilizing electromagnetic forces to counteract gravitationally induced flow.

In a still further embodiment, shown in FIG. 9, electromagnetic forces are induced in the molten material to counteract the gravitationally induced pressure. These forces act in the direction of arrows 70. In this method, a magnetic field, indicated by X's, is created perpendicular to a string guide tube 71 depending from a crucible 72. A current generated by connecting a DC source 76 across string guide tube 71 is then passed through the melt in this area in a direction perpendicular to both the axis of the guide tube and the applied magnetic field. The result is an upwardly directed electromagnetic force induced directly in the melt. This technique is used with materials that are electrical conductors when molten and where the crucible offers some resistance so that current will flow transverse to the tube axis. The magnetic field may be applied by current loops, and the field may be introduced indirectly through the crucible.

REDUCTION OF STRING CARRIED IMPURITIES

It will be appreciated that any string, no matter how well purified, will carry with it some impurities. As the string passes through the melt, these impurities enter the melt and cause its contamination.

Two techniques may be used simultaneously to reduce the level of such impurity introduction. First, the residence time of the string within the melt is minimized by making the melt depth as small as possible. However, no matter how short the residence time, some impurities will enter the melt from the string. This may be avoided by freezing a layer of melt to the string as it enters the melt.

In one embodiment, the string is cooled before it enters the melt, thus freezing the melt to it on contact. In one method, the string is cooled by passing cooled gas over it as it enters the melt. However, after a small amount of time, the string will warm up to the melt temperature, and the newly frozen material will melt, thereby requiring geometry in which the residence time of the string in the melt is minimized as by reducing the melt depth.

Figure 10:
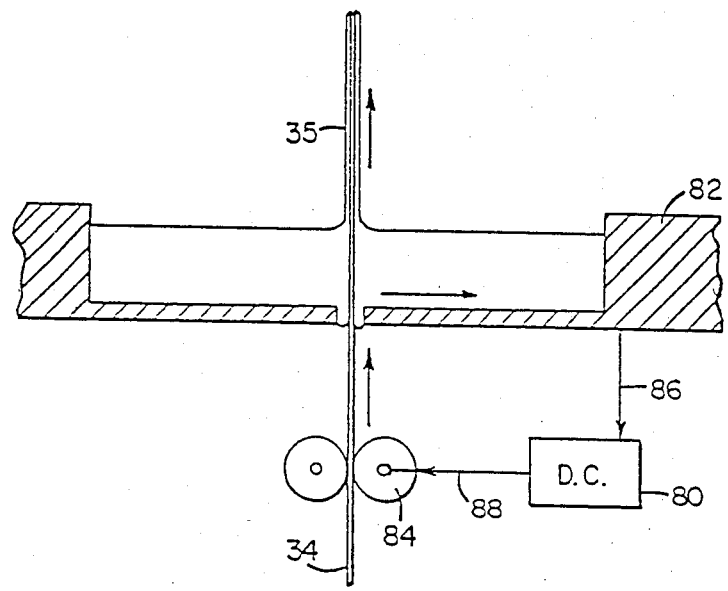
FIG. 10 is a diagrammatic illustration of thermoelectric melt freezing resulting in impurity trapping at the string.

In another embodiment, a thermoelectric effect between the string and the melt is used to freeze the silicon around the string. In this technique, illustrated in FIG. 10, a current is passed through the string 34 in the region below the melt. This current is generated by a DC source 80 which is connected to crucible 82 via line 86 and to string 34 via line 88 and conductive rollers 84. In operation, current passes along the string, through the junction between the string and the melt, through the melt and crucible, then back to the source through line 86. It will be appreciated that any two dissimilar conductors will have between them a relative Peltier coefficient, a measure of the thermoelectric potential. If a current is caused to flow across such a junction, heat is either evolved or withdrawn at the junction, depending on the direction of current flow. In the case of silicon and graphite, graphite may be doped (e.g. with boron) as to have a significant Peltier coefficient with respect to silicon. Thus, the Peltier effect may be used to withdraw a small amount of heat directly from the string melt interface. Assuming sufficient current, the Peltier effect will cause a small amount of material to quickly freeze around the string as it enters the melt, thus sealing in the impurities.

In practice, both techniques, cooling the string and Peltier cooling, may be used. However, it should be noted that the passing of current through the string will cause a certain amount of Joule heating in the portion of the string leading to the melt.

SEGREGATION OF IMPURITIES INTO THE MELT

Figure 11:
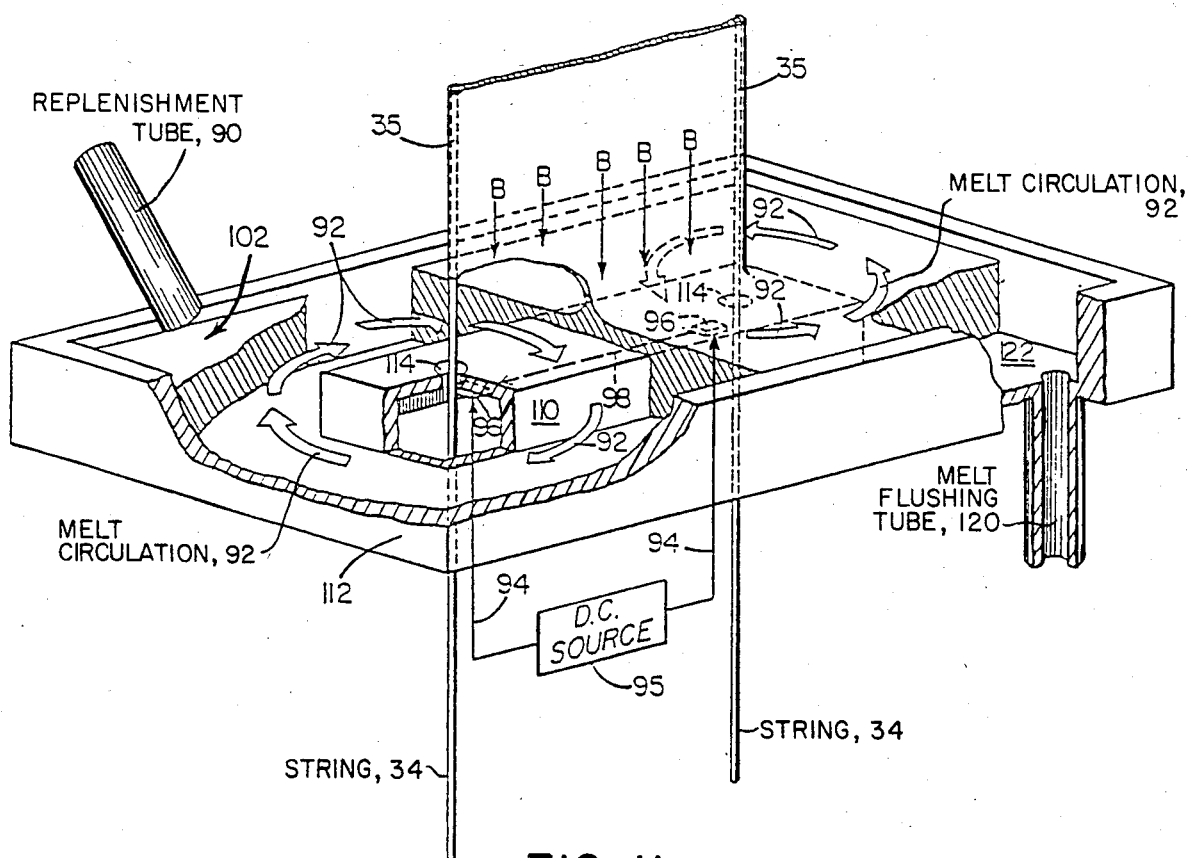
FIG. 11 is a diagrammatic illustration of impurity control with electromagnetic stirring combined with melt flushing.

In FIG. 11, whenever solidification takes place at a well defined interface, a phenomenon known as impurity segregation takes place. Because of considerations of chemical equilibrium, only a certain fraction of the impurities in the melt may be incorporated into the solid, the remainder being rejected at the interface. This segregation is used to advantage in almost all crystal growth processes in order to purify the material being grown.

In order to maximize the beneficial effects of impurity segregation, it is necessary to maintain a flow of melt by the interface in order to carry away the rejected impurities. Thus, the present invention includes maintaining a flow melt under the growing ribbon, substantially perpendicular to the plane of the ribbon.

However, segregation of impurities into the melt is not sufficient to insure significant purification of the material in a continuous growth process. This is because, in a continuous growth process using replenishment of the melt, the impurities rejected at the growth interface continually build up in the melt. As the level of impurities in the melt builds up, the amount of impurities incorporated into the ribbon also increases. In the present invention, this problem is solved by maintaining a constant flush or dumping of the melt. The functioning of this technique may be explained as follows:

Considering an impurity for which the segregation coefficient is 0.001, one part in a thousand of the impurities arriving at the interface is incorporated into the crystal. Assuming that the raw material has a 10 parts per million (ppm) impurity level, if the melt is composed only of such material, as will be the case initially, one would expect to grow a crystal of 0.01 ppm impurity level due to the segregation coefficient of 0.001. However, with the passage of time, the impurities accumulate in the melt and eventually the crystal will have 10 ppm of impurity, i.e., the impurity level of the incoming material. At this point, since the crystal has an impurity concentration of 10 ppm, the melt will actually have 10,000 ppm of impurity. However, if 1/10th of the melt is continually dumped in the steady state, with replenishment of fresh stock with 10 ppm impurity concentration, it can be shown that the melt will have approximately 100 ppm of impurity and the crystal will have 0.1 ppm of impurity. Thus, a high degree of purification is maintained even in the steady state.

FIG. 11 illustrates the manner of continual replenishment, circulation and flushing of the melt. Means for reducing melt depth to minimize string residence time is also illustrated. The replenishment system is indicated schematically by a tube 90 through which small bits of raw material are dropped into the melt. The circulation of the melt under the growth interface is accomplished by substantially circular motion of the melt, with one circulation eddy on either side of the ribbon midline as illustrated by arrows 92. In the case of an electrically conducting melt, this circulation can be accomplished by induced electromagnetic forces in the liquid melt. For example, if the crucible is made of graphite and the melt is silicon, leads 94 can be attached from a DC source 95 to the crucible bottom near the ribbon edges adjacent string introduction apertures 114 at contacts 96. The substantially higher electrical conductivity of the liquid silicon with respect to the graphite causes the majority of the current to flow through the liquid silicon as illustrated by dotted arrow 98. A magnetic field is simultaneously applied perpendicular to melt surface 102, such that the induced forces in the melt causes it to circulate in approximately the manner indicated. The direction of the magnetic field is indicated by arrows B. This magnetic field may be applied by external magnets or, more conveniently, by the field induced by the current passing through the main furnace heater if a heater coil is used.

A hollow barrier 110 is disposed in crucible 112 to reduce the impurity level by reducing the melt depth, with the barrier having the aforementioned string introduction apertures 11 therethrough.

Melt dumping may be accomplished through the use of a melt flushing tube 120 projecting downwardly from crucible bottom 122. Dumping may be controlled through the selective sealing available through induced electromagnetic forces described previously. Alternatively, the tube may be sealed by maintaining the tip at a temperature slightly below the melting temperature of the melt. A slight application of heat to the tip by means of a small resistance heater or the like, suffices to thaw the material in the tip and allow it to flow out of the crucible.

FURNACE CONSTRUCTION

Figure 12:
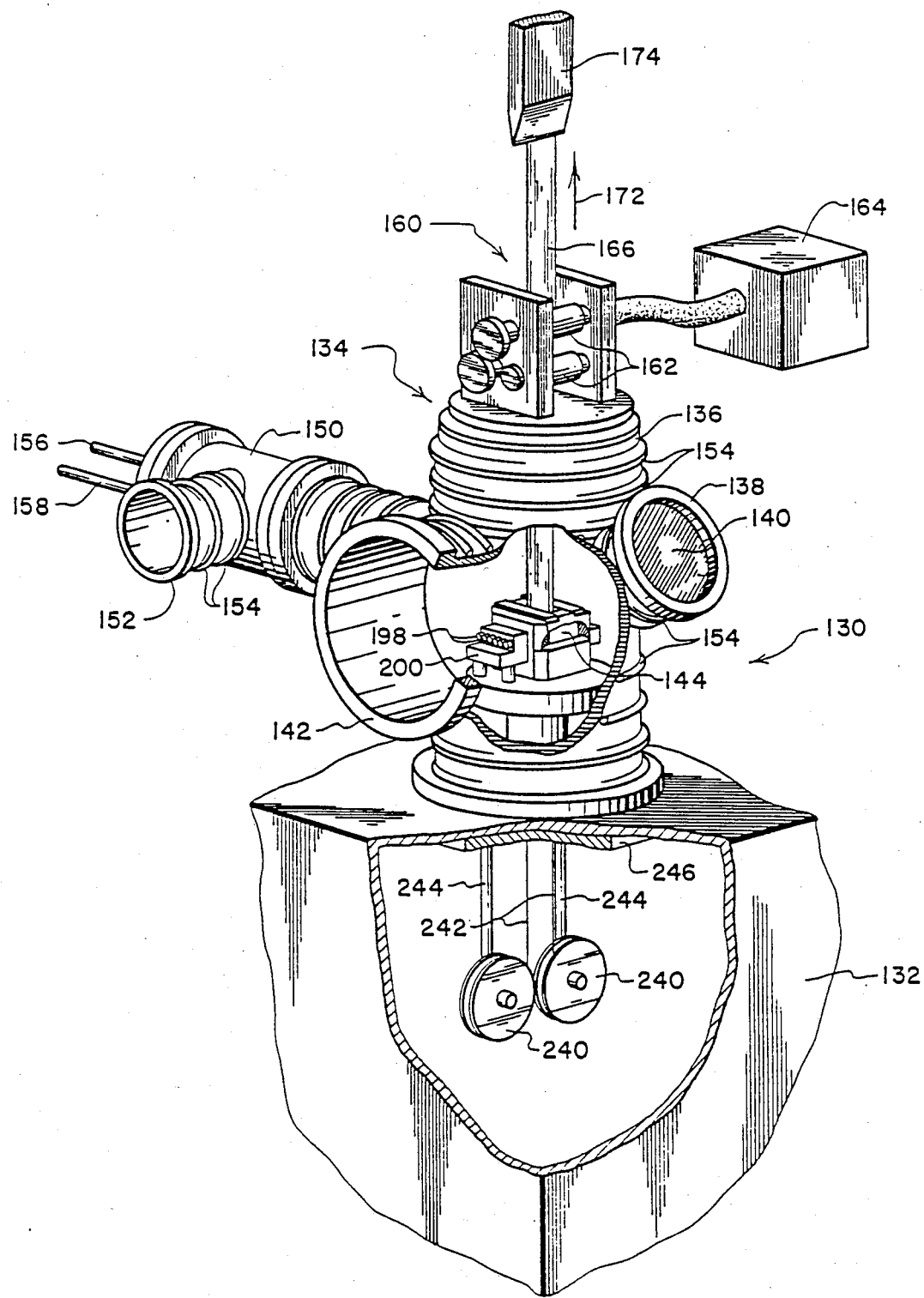
FIG. 12 is an isometric view of one embodiment of an improved furnace for use in the string stabilized growth of ribbon.

Referring to FIG. 12, a furnace 130 is illustrated having a base 132 to which is secured a main water-cooled housing 134 defining therein a vertically extending chamber 136. The furnace is provided with an angularly offset viewing extension 138 having a sealed viewing port 140 of glass or other light transmissive material, a loading port 142 through which a crucible 144 and all furnace components may be inserted, and a housing extension 150 projecting radially outward from main housing 134. Within chamber 136 a heater contact block 200 is disposed to retain heater rods 198 which run through the base of the crucible to heat the melt carried therein (See FIG. 13A). Water cooled electrical conductors 156 and 158 provide electrical power to heater contact blocks.

Housing extension 150 includes a vacuum pump extension 152, which may be used either for evacuating the housing or for introducing an inert gas which flows over the crucible and exits from the top of chamber 136 through the aperture provided for the ribbon's exit. Coils 154 are arranged to circulate a cooling liquid to dissipate heat from chamber 136. Ribbon pulling apparatus generally indicated at 160, located on top of main housing 134, includes rolls 162 which are powered by an auxiliary motor 164, and which are adapted to engage a ribbon 166 to pull it upward as indicated by arrow 172. A fixture 174 is provided to hold a seed crystal utilized to initiate ribbon growth and to which the ribbon is affixed.

Figure 13A:
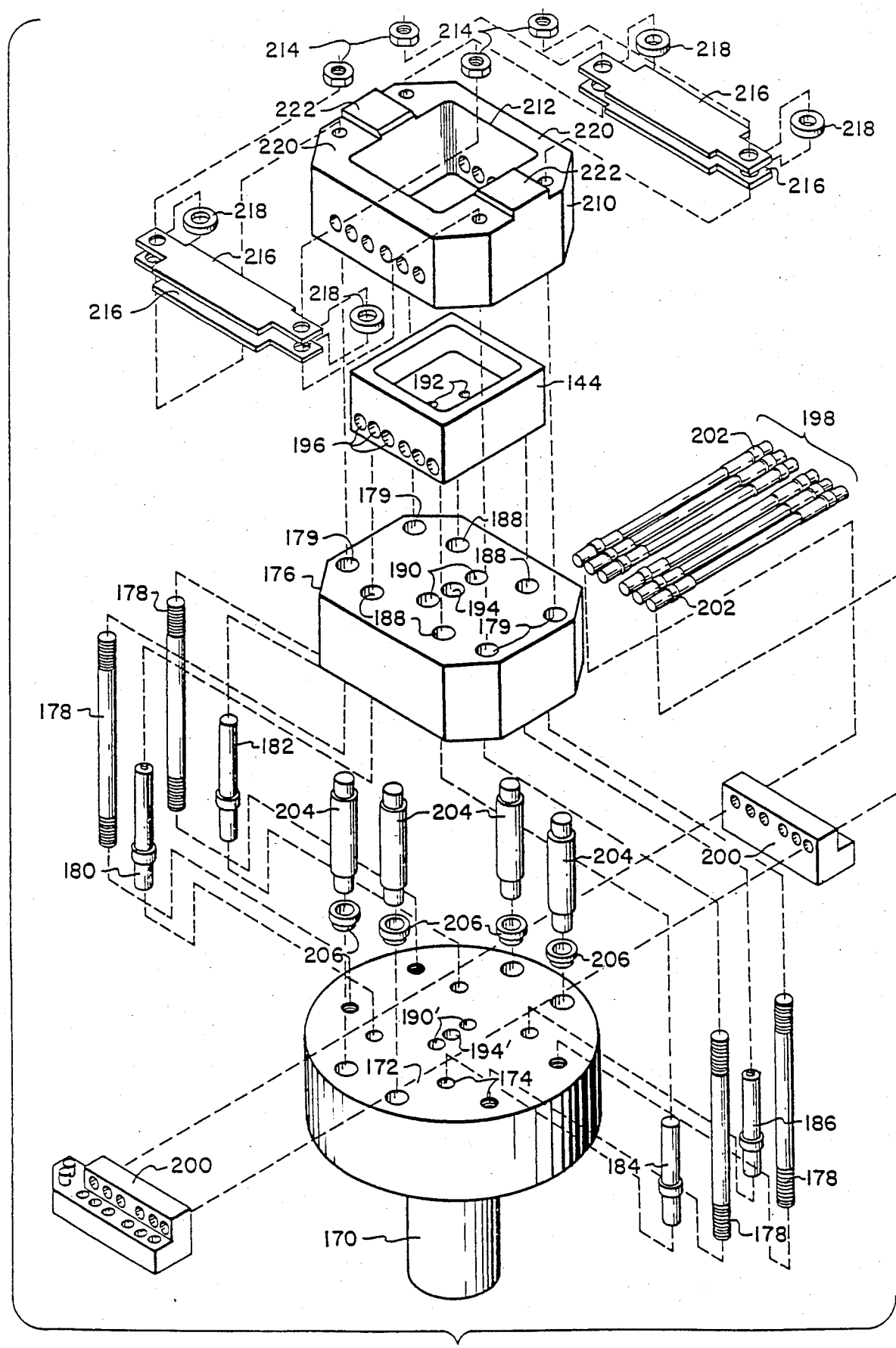
FIGS. 13A-13F illustrate the crucible assembly for the furnace of FIG. 12, in exploded view, and as partially and fully assembled.

FIG. 13A is an exploded view of the apparatus contained within the chamber 136. Crucible 144 is mounted to a pedestal 170 which has a top surface 172 into which apertures 174 of various diameters are machined to accommodate screw threaded, press fit or slide fit pieces. A lower insulation pack 176 is placed on pedestal 170 and is maintained in position by locator posts 178 which extend through apertures 179 in insulation pack 176. Crucible 144 is mounted over insulation pack 176 and is positioned and supported by support posts 180-186 which project through apertures 188 in the lower insulation pack. Lower insulation pack 176 is also provided with apertures 190 through which string positioning tubes (FIG. 14) project, these tubes serving to guide the stabilizing strings into crucible 144 via apertures 192 in the crucible bottom. Additionally, an aperture 194 is provided in the lower insulation pack to accommodate a central thermocouple protection tube (FIG. 14) housing a thermocouple. Pedestal 170 is provided with corresponding apertures 190' and 194' to accommodate the string positioning tubes and the thermocouple protection tube.

With respect to the crucible, crucible 144 is provided with channels 196 which act as radiative cavities for heater rods 198 which pass therethrough. The heater rods are supported by heater contact blocks 200 apertured to accommodate ends 202 of the heater rods in a sliding fit, as will be described. The contact blocks are supported on pedestal 170 by support posts 204 which are electrically insulated from pedestal 170 by sleeved bushings 206. Support posts 204 are made of graphite, as are locator posts 178, with bushings 206 being made of boron nitride. The crucible is made of graphite in one embodiment, it being understood that the crucible can be made of a variety of materials ranging in wettability from that associated with carbon to that associated with quartz or boron nitride. The insulation packs in one embodiment are made of Fiberform which is a trademark of Fiber Materials, Inc., of Biddeford, Me. Generally, Fiberform is formed from a colloidal suspension of grahite.

An upper insulation peak 210 which has been suitably apertured so as to receive locator posts 178 and heater rods 198 surrounds crucible 144. This insulation pack is provided with a central cut out portion 212 adapted to surround the outer walls of crucible 144. Graphite nuts 214 bolted to locator posts 178 clamp the entire structure together. Double graphite radiation shields 216 spaced by graphite washers 218 are maintained in horizontal speed adjacency on surface 220 at the top of the upper insulation pack by raised portions 222 integrally formed in the upper insulation pack. Sufficient space is provided between the shields to accommodate the emerging ribbon. The radiation shields are made of solid graphite as opposed to Fiberform so that there is no particulate matter to fall into the melt.

Figure 13B:
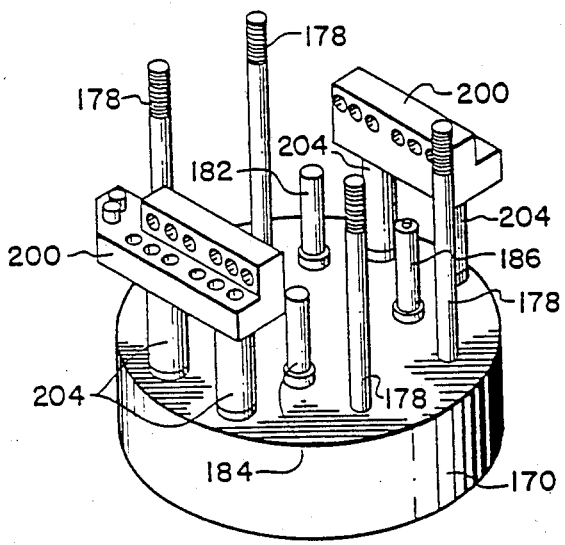
Figure 13C:
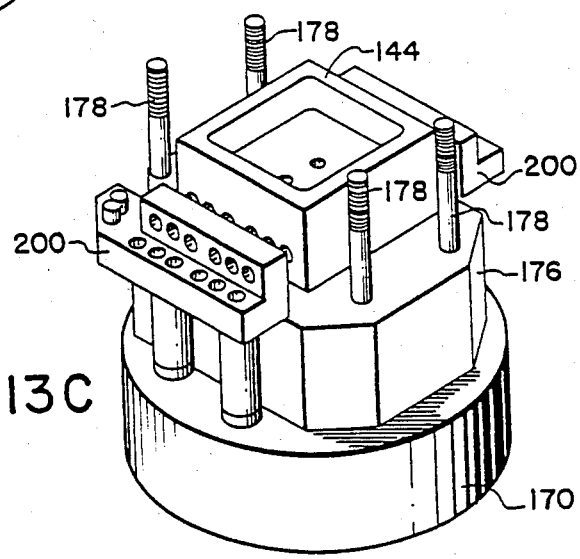
Figure 13D:
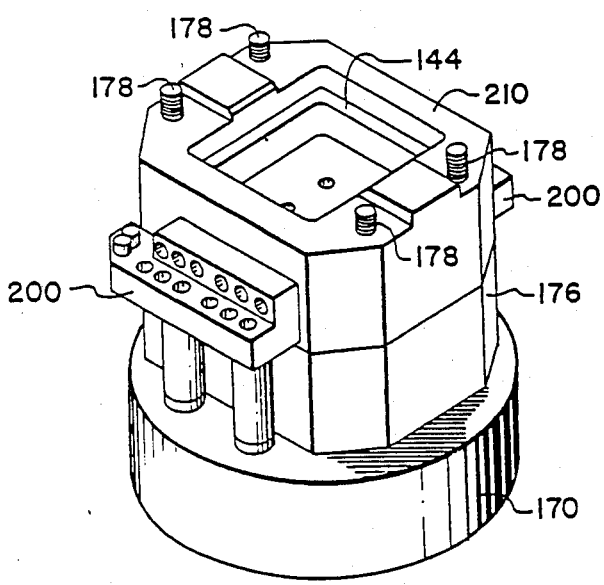
Figure 13E:
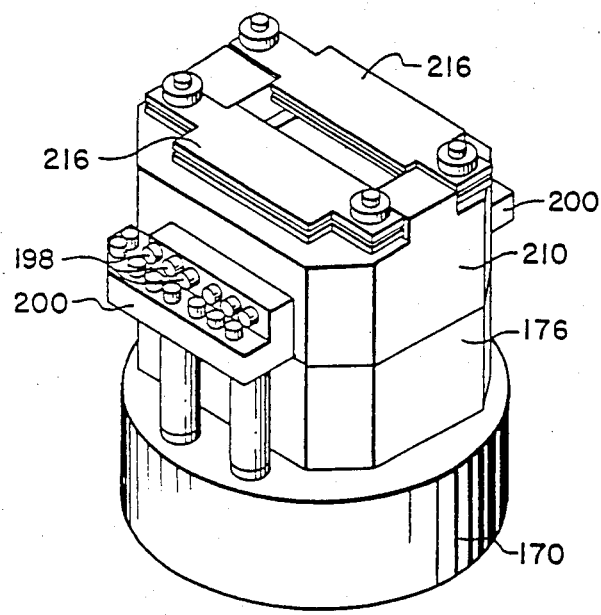

The manner of assembly of the apparatus of FIG. 13A is depicted in FIGS. 13B-13E. Referring to FIG. 13B, pedestal 170 is first provided with locator posts 178, support posts 180-186 (support post 180 not shown in this Figure); and contact block support posts 204. Contact blocks 200 are shown mounted on their respective support posts. In FIG. 13C, lower insulation block 176 is positioned over posts 178 and crucible 144 is mounted thereabove between contact blocks 200. As shown in FIG. 13D, upper insulation block 210 is then placed over lower insulation block 176 thereby surrounding crucible 144 as illustrated. Referring to FIG. 13E, heater rods 198 are passed through the apertures in contact block 200, through upper insulation block 210, through the crucible channels and through the apertures in the opposing contact block. Shields 216 are then bolted to the top of upper insulation block 210 in spaced adjacency as illustrated.

Figure 13F:
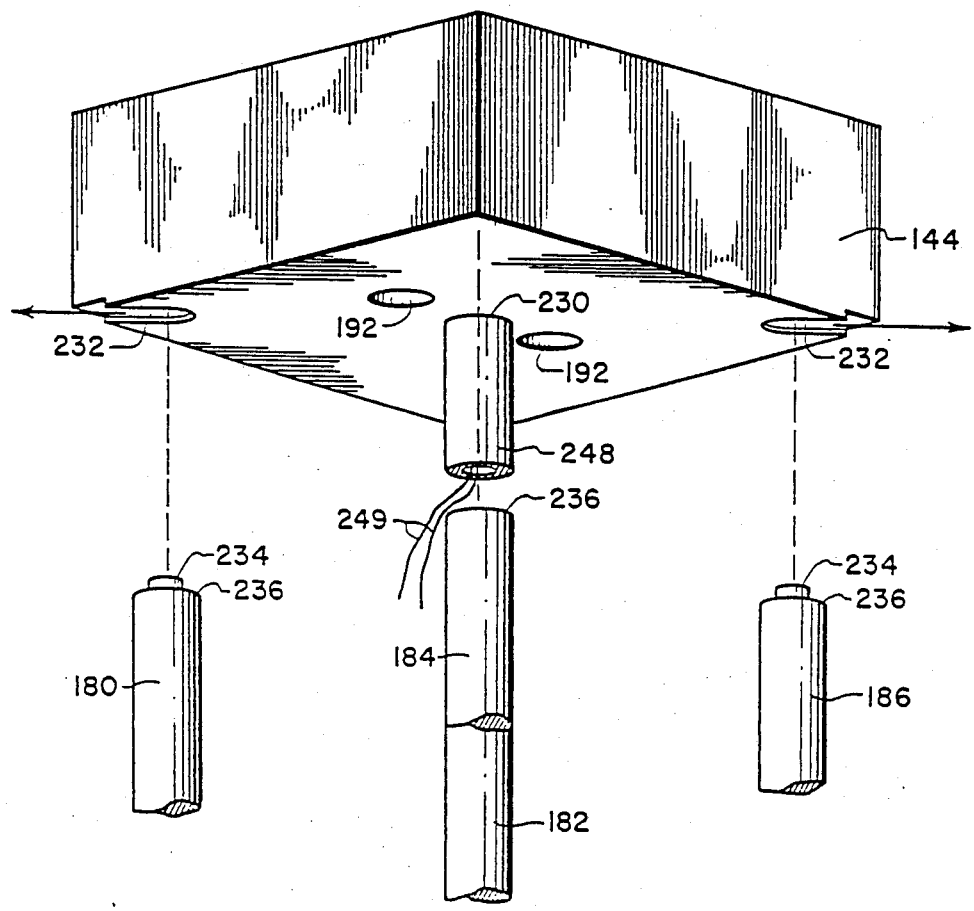

Referring now to FIG. 13F, crucible 144 has its underside provided with aforementioned apertures 192 for the general purpose of string introduction. A countersunk aperture 230 is adapted to accommodate a thermocouple protection tube 248 and a thermocouple housed therewithin, thermocouple leads being illustrated at 249. The thermocouple protection tube serves three functions. It assumes X, Y positioning of the crucible relative to the aforementioned pedestal. It is provided with a short length of screw thread which acts to hold the crucible down against supports 180-186. Finally, it houses the main furnace control thermocouple.

The bottom surface of crucible 144 is provided with radially extending channels 232 which are adapted to receive locator pins 234 projecting above the top surfaces 236 of support posts 180 and 186. When crucible 144 is positioned such that its bottom surface contacts the top surfaces 236 of support posts 182 and 184, pins 234 project into channels 232. The purpose of this crucible support structure is to assure angular positioning of the crucible and to accommodate linear thermal expansion and contraction of the crucible. It will be appreciated that the crucible may expand by as much as 1% from room temperature to operating temperature, which in the case of silicon is 1420° C.

Figure 14:
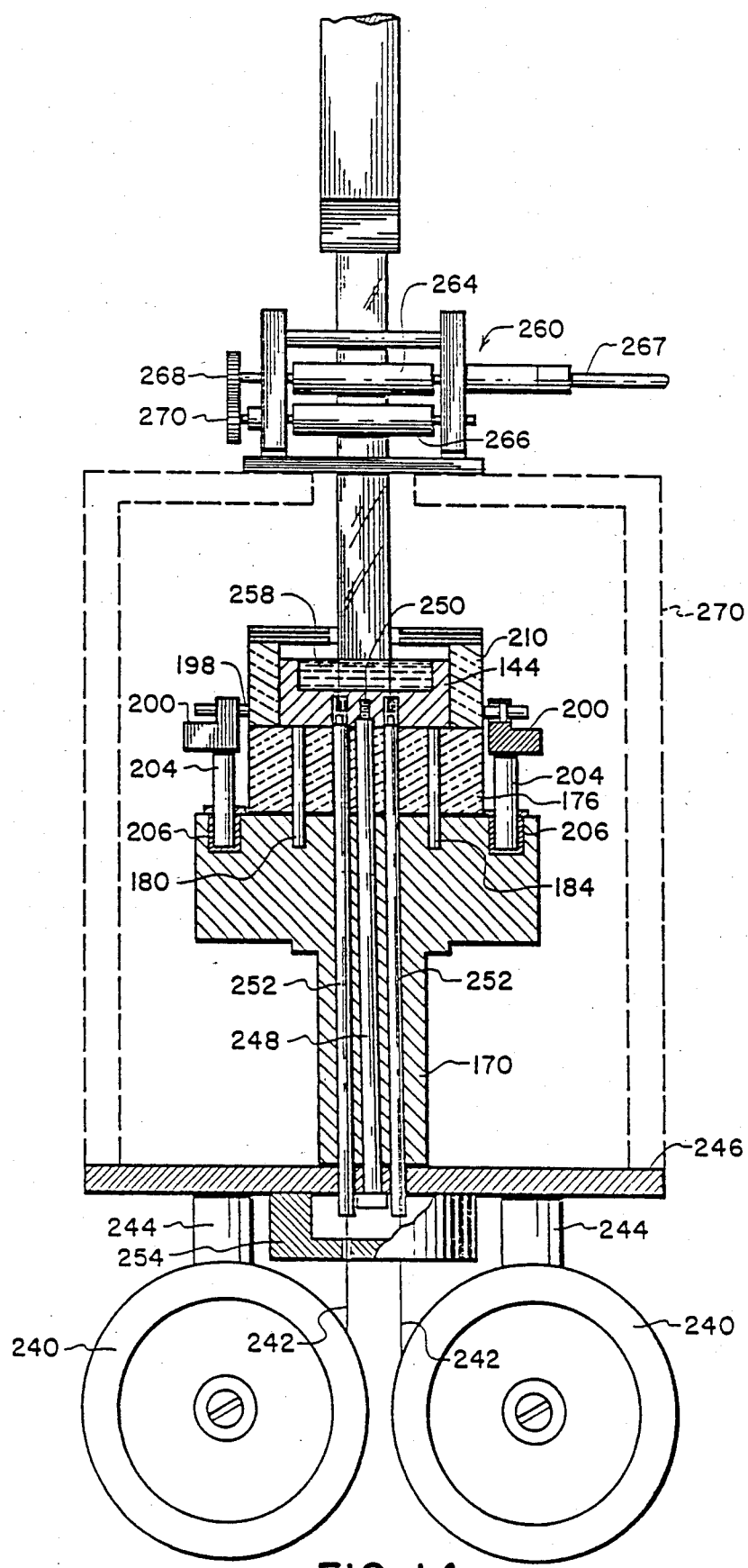
FIG. 14 is a partial cross-sectional view illustrating string introduction and ribbon pulling apparatus.

Referring now to FIG. 14, the string feed system is illustrated in which strings 242 are initially wound on spools 240. The spools can be biased or driven by motors or springs which oppose the feed direction to provide the requisite tension. The spools are suspended from supports 244 which depend from a plate 246 mounted to the bottom flange of the furnace. Pedastal 170 is also mounted to plate 246, with string positioning tubes 252, thermocouple protection tube 248 extending through plate 246 and then through mating apertures 190' and 194' in pedestal 170. Also butted to plate 246 is a small gas cup 254. This cup is provided with argon independently of the main furnace thereby establishing a small plenum chamber around all apertures in the furnace bottom. This assures that any flow of gas into the furnace through these apertures will be inert gas as opposed to surrounding air, flow being induced by a "chimney" effect in which hot less dense gas in the furnace causes an upward flow.

Ribbon pulling is accomplished by a ribbon drive unit 260 mounted on top of the furnace in which ribbon 262 is positioned between opposing rollers of drive unit 260. Driven roller 264 is paired with an idler roller (not shown) and idler roller 266 is paired with a driven roller (not shown). Driving roller 264 results in the rotation of gear 268 which drives an offset gear 270 to power the driven roller of the lower set.

Figure 15:
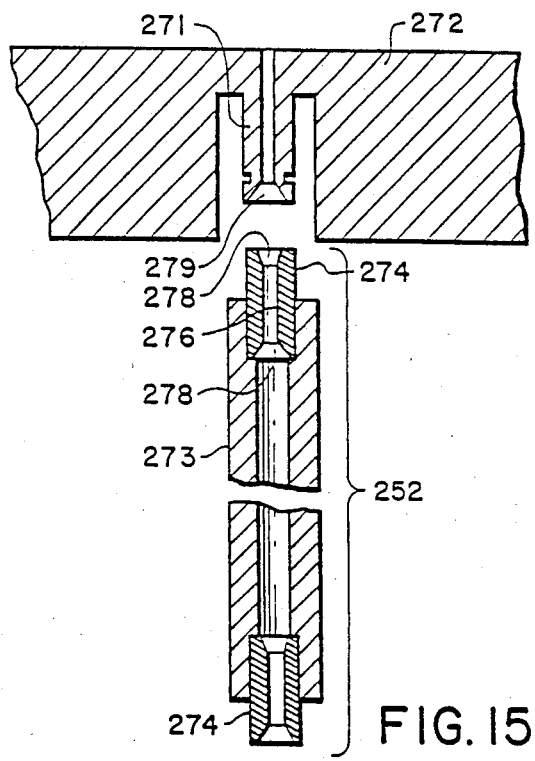
FIG. 15 is a cross-sectional illustration of a string positioning tube for use in the furnace of FIG. 12.

The string positioning tubes 252 of FIG. 14 may be given the configuration illustrated in FIG. 15 where their relationship to a string introduction tube 271 of a crucible 272 is shown. A cylindrical hollow rod 273 is provided with inserts 274. The inserts have a hollow central channel 276 and countersunk ends 278. Moreover, string introduction tube 271 may include a countersunk portion 279 to facilitate string introduction.

Figure 16:
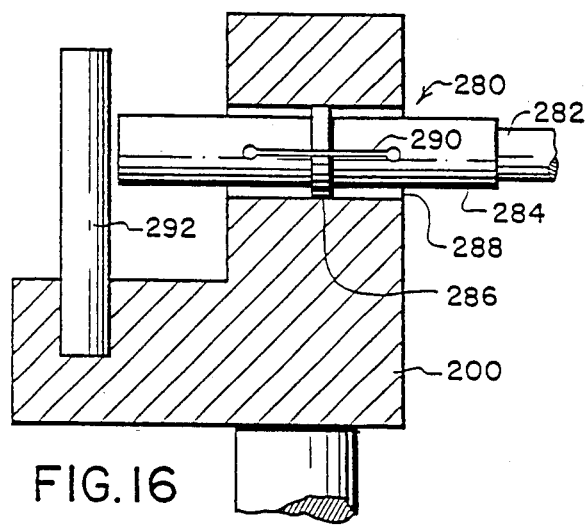
FIG. 16 is a diagrammatic illustration of a heater rod and connection block for use in the furnace of FIG. 12.

Referring now to FIG. 16, a portion 280 of a heater rod is shown inserted into contact block 200. The heater rods in one embodiment, are turned from round graphite stock to provide a central rod portion 282 of decreased diameter and an enlarged shaft end 284 having a circumferential contact rib 286. The shaft end with contact rib engages a channel 288 in block 200 in a sliding spring fit. End 284 and rib 286 are divided into four quadrants by slots 290 in the horizontal and vertical planes. This acts to create four integral graphite springs and provide flexibility for the aforementioned sliding spring fit.

The rod thus includes a type of sliding connector to accommodate thermal expansion along the length of the rod due to heating. This expansion may be on the order of 2% such that if the rods were clamped to the block, intolerable bowing would occur. A peg 292 is positioned at each end of each heater rod to retain the heater rod in proper position to prevent the heater rod from "working out" of the connector due to small oscillations in length during thermal cycling.

FURNACE OPERATION

In operation, a voltage is impressed across the heater rods in parallel via water cooled current leads 156 and 158. Thus, current is fed in through current lead 156 through heater contact block 200, divides through the parallel heater rods, is collected by the second heater contact block 200, and leaves by current lead 158.

The furnace is constructed to minimize the power consumed during operation. To this end heater rods 198 are disposed inside channels 196 within the crucible itself, to assure that all the power dissipated by the heater rod is received directly by the crucible, rather than a portion of it radiating directly to the insulation pack as would be the case for external heater elements. The result is that during operation with molten silicon at 1430° C., the total furnace power consumption is 3500 watts. The attainment of this low power consumption is further explained by noting that in the traditional furnace, the crucible is completely surrounded by a large graphite resistance heater. This heater must run at a temperature higher than the crucible operating temperature in order to communicate heat to it. In addition, the traditional large graphite resistance heater has a larger surface area than the crucible it surrounds. These two factors combine to yield a furnace power dissipation far in excess of the minimum requirement of keeping the crucible hot. By utilizing heater rods enclosed by the crucible, an approach may be made to the theoretically minimum power usage associated with a given amount of surrounding insulation.

Further, the use of heater rods facilitates reshaping of the temperature profile across the crucible so as to attain a nearly uniform profile. Such modifications may be made by changing the overall resistance of one or more elements with respect to the others with which it is in parallel. A larger diameter heater rod will have lower resistance and will therefore dissipate more heat than the others, in a parallel arrangement. The individual heater rods may also be shaped along their lengths, larger lower resistance portions dissipating less heat than an adjacent narrower portion because of the series arrangement. Finally, the heater rods may be repositioned, thereby effecting substantial changes in profile. Once a satisfactory profile is obtained, it is highly reproducible, requiring only the substitution of a similarly machined heater element for a spent element.

During start-up, silicon or other working material is melted in crucible 144 by supplying power to heater rods 198. The strings are then introduced into the bottom of string positioning tubes 252 and are fed up through these tubes and through apertures 142 in the bottom of crucible 144. The proper positioning of tubes 252 relative to crucible 144 is assured by the crucible locating means comprised of thermocouple protection tube 248 and crucible support posts 180-186 described previously. Note that the thermocouple protection tube determines the X-Y positioning of the crucible at a point directly between the two string introduction apertures 192, thereby minimizing any location errors of apertures 192 with respect to tubes 252. Easy upward motion of the strings is further insured by the use of countersinks as described with reference to FIG. 15.

Other convenient aspects of furnace use are the ability to withdraw positioning tubes 252 from the furnace during a run. This becomes necessary in the event of a string jamming or as droplets freeze within the tube. In such an event, the tube may be simply withdrawn from the bottom of the furnace, cleaned and replaced. Similarly, the thermocouple may be withdrawn from tube 248 and replaced during a run with minimum elapsed time.

CAPILLARY RETENTION OF MELT WITHIN APERTURES IN THE CRUCIBLE BOTTOM

Figure 17:
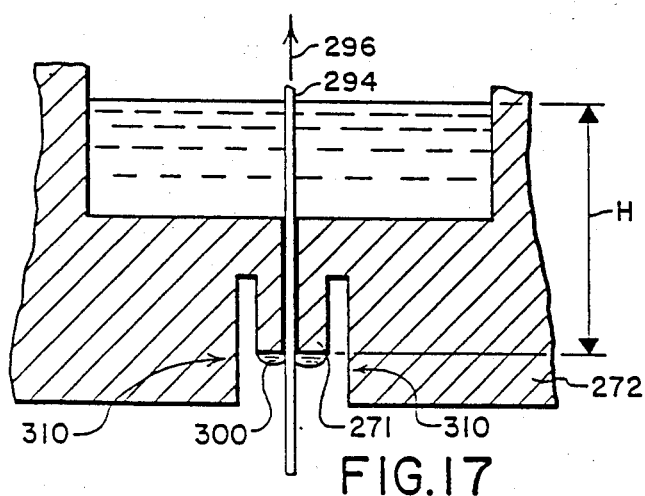
FIG. 17 is a cross-sectional view of a string introduction tube surrounded by crucible walls to prevent the freezing of melt in the string introduction tube.

What is now described is the capillary retention of melt at an orifice in the crucible bottom. In one embodiment, capillary retention may be effected by using a downwardly projecting cylindrical tube at the orifice, in which the tube is fabricated of the wetted, or partially wetted crucible material. Such an arrangement is shown in FIG. 17 and is described in connection with string introduction. The present discussion assumes no string present.

In principle, this tube functions by balancing the gravitational head of the melt with capillary forces associated with the bead of melt that forms at the bottom of the tube. For any given configuration and liquid, there will exist a maximum head that may be supported in this manner. With H the distance from the free melt surface to the bottom of the tube and r the outside radius of the cylindrical tube, the maximum head supportable may be found by assuming that the drop beneath the projection is hemispherical with radius r.

It follows that:

$$rH_{max} = \frac{2\gamma}{\rho g} \quad \text{(Eq. 3)}$$

or $$H_{max} = \frac{2\gamma}{\rho g r} \quad \text{(Eq. 4)}$$

Thus, if the melt level is such that the distance from the free surface to the bottom of the tube is less than $H_{max}$ no leakage will occur. However, if this distance should increase beyond $H_{max}$, leakage will occur until the melt level is lowered and the distance from melt surface to the bottom of the tube is $H_{max}$. At this point, the leakage will stop.

For any given material $r \cdot H_{max}$ is a constant determined by material parameters alone. For silicon, $$r \cdot H_{max} = \frac{2\gamma}{\rho g} = 0.587 \text{ cm}^2.$$

However, the designer may exercise control over $H_{max}$ by changing the radius, r, of the tube. For example, decreasing this radius will increase the maximum head that is supported.

CAPILLARY RETENTION OF MELT DURING STRING INTRODUCTION

The string introduction technique illustrated in FIG. 7 may represent an unstable condition if using a wetted crucible since when the silicon wets the bottom of the crucible, its wetting area increases and therefore the head that may be supported at the introduction aperture will decrease. This will lead to the possibility of melt leakage. When a small downward cylindrical tube is utilized as outlined above, the tube defines the limit on the wetting area of the liquid.

For the case of string introduction, $H_{max}$ is made significantly greater than the maximum expected distance H between the melt surface and the tube end. Typically, for a system where H=1.3 cm, a string introduction tube is used where r=0.16 cm, resulting in a maximum stable head $H_{max}$ of 3.67 cm.

The provision of a string within the tube has little effect on the amount of head that may be supported. This may be understood as follows: Referring to FIG. 17, string 294 is travelling upward as indicated by arrow 296. The type of wetting which will exist at the bottom of string introduction tube 271 is illustrated by melt droplet 300. This type of wetting of the string will actually increase the maximum head allowed as more surface is available for meniscus attachment. Even downward motion of the string will have little effect on the supportable head, as the small radius of curvature around a small string guarantees that significant heads may be supported regardless of the angle of attachment to the string. This type string introduction tube may be used both for vertical and angled growth.

Figure 18:
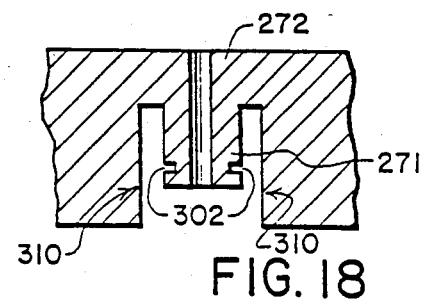
FIGS. 18, 19, and 20 illustrate meniscus control flanges for preventing meniscus creep.
Figure 19:
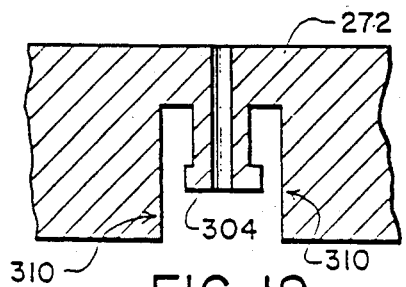

Depending on the precise nature of the interaction between melt and crucible material, the droplet at the bottom of the string introduction tube may creep up the sides of the tube, resulting in a lower maximum supportable head due to a larger wetted area. This process may be kept from continuing by the embodiments of either FIG. 18 or FIG. 19. In FIG. 18 a small annular indentation 302 serves to stop the advancement of the melt up the projection because of meniscus attachment properties which cause the meniscus to attach at the discontinuity formed at the junction of a vertically running surface met by an inwardly projecting surface. In FIG. 19 an annular ridge or flange 304 serves the same purpose.

Figure 20:
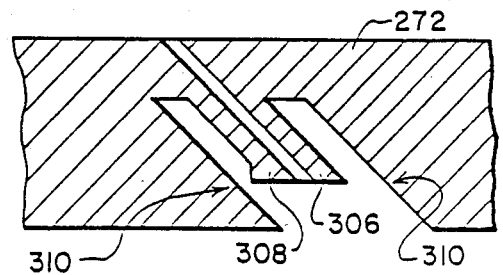

Referring to FIG. 20, a string introduction tube 306 may be provided with a ridge or flange 308 on its underportion so as to accommodate an angular orientation of the string with respect to the melt surface and so as to provide increased leakage protection. Additionally, the configurations of FIGS. 18 and 19 may also be used for angled growth. Note that the improvements embodied in FIGS. 18, 19 and 20 are not restricted to string introduction ports, but may also apply to suction draining and capillary overflow melt dumping described hereinafter.

PREVENTION OF MELT FREEZING

The string introduction tubes of FIGS. 18, 19 and 20, if left exposed, can result in the freezing of the melt within the tubes. In order to maintain the temperatures of the tubes above the melt temperature, a profile 310 of the crucible 272 may be extended to completely surround the projection tube thereby forming a radiative cavity around the tube as illustrated. In one embodiment the bottom of the crucible is counter-bored at the string introduction aperture and a smaller string introduction tube is mounted concentrically in the counter-bore so that the surrounding crucible walls are in spaced adjacency with respect to the string introduction tube.

SUCTION DRAINING OF MELT

With respect to melt dumping and more particularly with respect to FIG. 21, the melt as described hereinabove, may be dumped by providing the crucible with a downwardly projecting tube and by controlling the outflow from the tube by freezing and thawing the material at the tip. This assumes the "spigot" to be long enough, i.e. extend sufficiently below the melt so that capillary cannot prevent the liquid from leaving the tip when the tip is thawed out.

Figure 21:
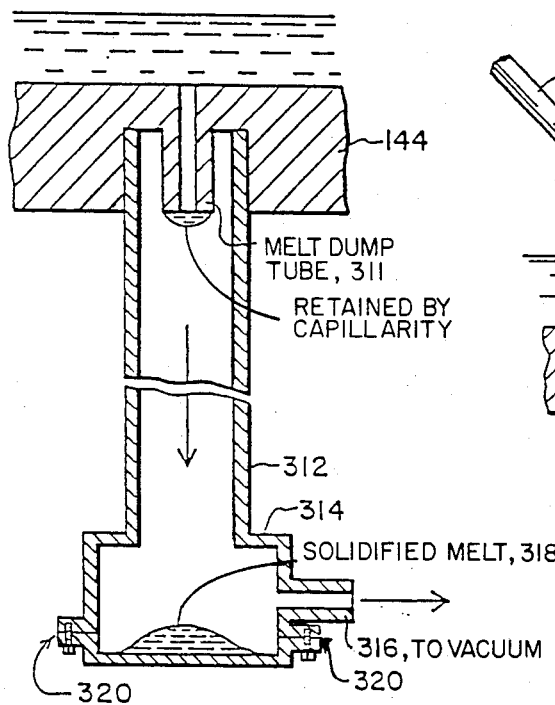
FIG. 21 is a cross-sectional diagram illustrating suction control for melt dumping.

However, as illustrated in FIG. 21, an alternative is to keep the molten silicon in by capillary in which $rH \leq 2\gamma/\rho g$, and apply suction at the tip when it is desired to withdraw silicon. In order to accomplish this, an exit conduit 312 communicates between the crucible and a dump receptacle 314 which may be evacuated through a conduit 316 by vacuum apparatus (not shown). Suction is applied to the receptacle whenever it is desired to withdraw melt from the crucible. This is accomplished in a semi-batch or nearly continuous mode as desired. The result is that solidified rejected silicon is deposited as illustrated at 318, with a relatively long length of conduit 312 being provided. Recepticle 314 may be made of graphite and it may be severable as illustrated by the flange/bolt attachment system diagrammatically illustrated at 320.

CAPILLARY OVERFLOW MELT DUMPING

Figure 22:
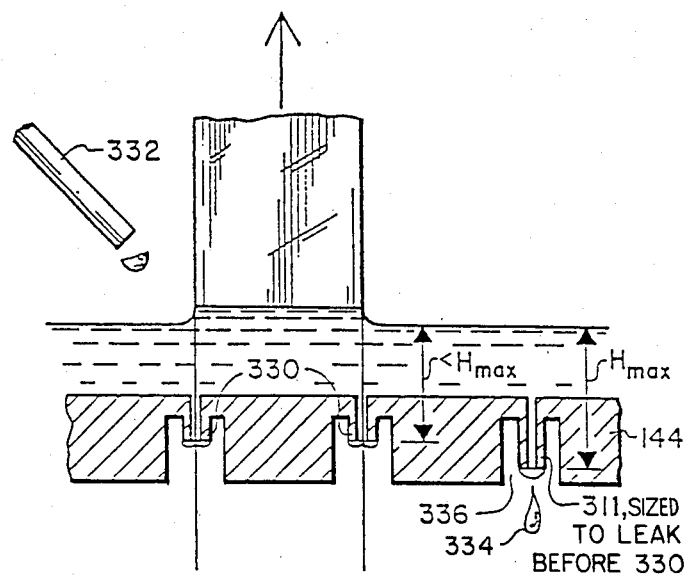
FIG. 22 is a diagrammatic illustration showing the use of a capillary tube for melt dumping control.

Referring now to FIG. 22, crucible 144 is provided with a melt dumping tube 311. Since string introduction tubes 330 have a predetermined maximum head that will be supported, any head above this maximum will cause a slow leakage until a steady state level is attained. If tube 311 is either longer or has a larger diameter as compared with tubes 330, it acts essentially in the manner of an overflow valve.

The maximum head, $H_{max}$, supported by a tube is determined by its outside diameter. Thus, two tubes of equal outside diameters support the same maximum amount of head. By making tube 311 longer than string introduction tubes 330, when the melt level is increased, the melt level at which leakage occurs at tube 311 will be reached before the level at which melt would leak from tubes 330. Of course tubes 330 and 331 may be of different diameters and thus support different maximum melt heads. Thus the relative diameters and lengths may be adjusted so that leakage occurs first at tube 311. This leakage will continue until the melt level is reduced sufficiently to allow the melt dumping tube 311 to seal by capillarity.

Capillary overflow melt dumping is capable of very precise melt level control, since the melt rises past the point where $H = H_{max}$ leakage will begin and continue until $H = H_{max}$ at which point it will stop. Thus, the melt level is automatically controlled in a manner requiring no melt height measurement or external feedback. Further, it should be noted that the melt will overflow in a well controlled manner drop by drop. This may be understood by noting that for H slightly greater than $H_{max}$, the capillary forces at the bottom of the melt dumping tube are almost, but not quite, balancing the forces from the gravitational head. Thus, the melt is being forced to flow out by only a small pressure differential and will therefore flow out in a well controlled manner. In one embodiment, the melt replenishment rate is made to exceed the growth rate by, for instance, 20%. Thus, 20% of the melt will be continually dumped thereby leading to considerable melt purification.

Note that any suitable combination of tube length and radius may be used. In practice, however, the radius of the melt dumping tube will roughly determine the size of the effluent drops. Relatively fine drops are desired so that they do not clog up area 336. This establishes an upper limit on tube radius. In one embodiment r=0.2 cm, and H=2.93 cm.

GROWTH AT AN ANGLE TO THE FREE MELT SURFACE THEORETICAL CONSIDERATIONS

It can be demonstrated that when an edge stabilized ribbon is pulled from the melt at an angle, the ribbon will assume a trough shape. It has been found that "flat" ribbon can be grown by providing means which permit the angular orientation of the meniscus surface at its lower attachment point to be something other than its normal tangential angle, e.g., tangential to the melt surface. The ability to grow flat ribbon may be explained by the effects of geometrical and thermal constraints on the growth of a thin sheet or ribbon.

Figure 23:
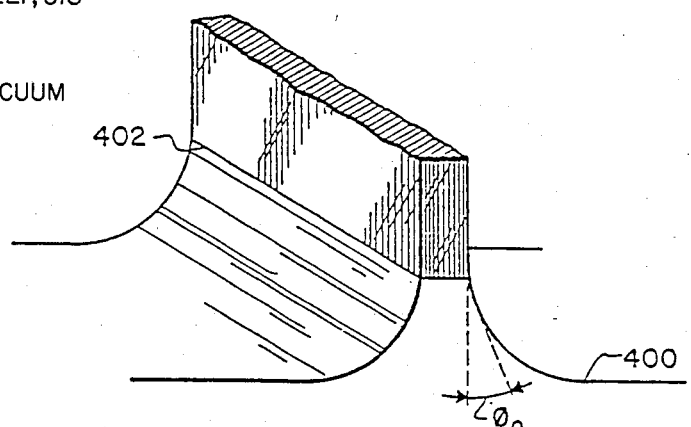
FIG. 23 is a diagrammatic illustration representing conditions for vertical ribbon growth.

The geometrical constraints arise primarily from the action of surface tension on the meniscus and the allowable angles of attachment of the meniscus to the melt ribbon, etc. The thermal constraints stem from material parameters such as heat of fusion and thermal conductivity, as well as from the heat withdrawal mechanisms present, e.g., radiative or conductive. With respect to these constraints and their interactions, a more detailed discussion of the geometrical constraints than is described in connection with FIGS. 5A–5D is now described. Although this discussion applies to growth at any angle to the melt, it will be illustrated by reference to a cross-section through a ribbon grown vertically as shown in FIG. 23. As noted previously, the meniscus must join the melt surface smoothly as illustrated by reference character 400, so as to join the melt surface tangentially; that is, the meniscus must have zero slope at a free horizontal melt surface. Thus, the angle of attachment of the meniscus to the melt is zero. This may be understood physically by noting that the meniscus is in fact composed of nothing but melt. Therefore, there is no physical boundary that would provide a basis for discontinuity in slope of the liquid surface. However, whenever the meniscus attaches to a solid body such as a solidified ribbon, a non-zero angle of attachment will, in general, be formed. The meniscus must meet the growing crystal, at a specific angle $\phi$, the angle determined by the properties of the material being grown. For silicon this angle is approximately 11°. The line of attachment of the meniscus to the growing crystal is referred to herein as the interface edge depicted by reference character 402.

In computing the precise shape of the meniscus surface, these conditions of meniscus slope constitute the boundary conditions. Between the ends, meniscus shape is determined by the influence of capillary forces as embodied in Laplace's equation:

$$\Delta p = \rho g h = \gamma \left( \frac{1}{R_1} + \frac{1}{R_2} \right) \quad \text{(Eq. 5)}$$

where $\Delta p$ is the pressure drop being supported across the liquid gas interface by capillarity. $\rho$, g, h, and $\gamma$ are defined hereinbefore, and $R_1$ and $R_2$ are the principal radii of curvature of the meniscus surface. Whenever a "flat" ribbon is being grown, either vertically or at an angle, one of the principal radii, $R_2$, is infinite. In this case equation 5 reduces to the equation 1, where $R_1 = R$. Since it is generally desired to grow flat ribbon, the reduced form equation 1 is generally applicable. However, in order to fully understand angled growth, use is made of the general equation 5. As may be seen from both equations 1 and 5, the local radii of curvature of the meniscus surface are a function of the height h of the point in question above the free melt surface. Thus, in simple vertical growth, the radius of curvature of the surface of the meniscus is continually decreasing as one moves up the meniscus from the melt surface to the growth interface.

In order to clarify the following discussion several simplifications are made with no loss of generality: The angle of attachment of the meniscus to the ribbon, or interface attachment angle $\phi_0$, is taken as zero degrees; and the meniscus surface is taken to have constant curvature, thus ignoring the dependence of surface curvature on height h.

Figure 24:
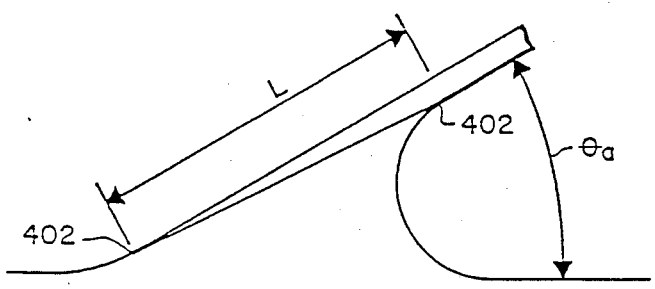
FIGS. 24 and 25 are diagrammatic illustrations representing conditions for angled growth, illustrating measurement of meniscus height and curvature.

Referring to FIG. 24, with respect to growth at an angle, $\theta_a$, to the melt surface, this figure presents a cross-sectional view of the growth of flat ribbon from the melt surface with the aforementioned assumptions of zero interface attachment angle and a constant radius of curvature for the meniscus surfaces. As previously noted, interface edges 402 constitute the line of attachment of the meniscus to the growing ribbon. As may be seen from FIG. 24, a very large distance L exists between these interface edges as measured along the ribbon length. Referring back to FIG. 23, symmetry dictates that this distance be zero for the simple case of vertical growth of ribbon from the melt surface. However, in the angled growth of FIG. 24 a separation of the two interface edges exists with a resultant vast enlargement of the growth interface. It is this enlarged growth interface and its orientation substantially parallel to the ribbon which brings about the principal advantages of angled growth, to wit, higher speed due to a larger area for heat removal, lower thermal stresses due to the extraction of heat perpendicular to, rather than parallel to, the pulling direction, and the greater tendency of any unwanted crystal structure such as grain boundaries, to grow only a short distance due to propagation toward the ribbon surface as opposed to propagation along the ribbon length.

As illustrated in FIG. 24, the meniscus heights on the two sides of a ribbon grown at an angle to the melt will be different. The term meniscus height is more rigorously defined as the vertical distance between the free melt surface and the interface edge on the corresponding side of the ribbon. It is with a qualitative understanding of the origin of this difference in meniscus heights that angled growth can be understood.

Figure 25:
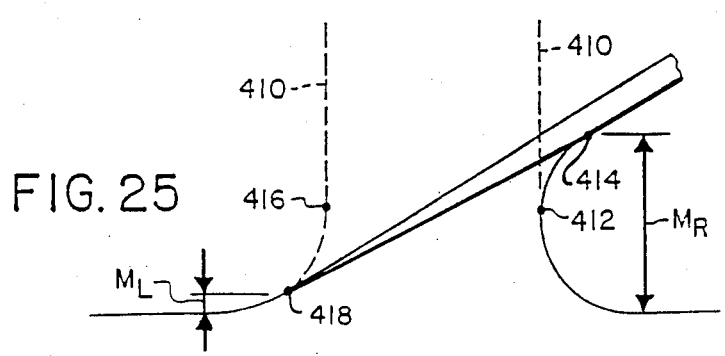

FIG. 25, serves to illustrate the critical parameters of the interface of FIG. 24. As can be seen from FIG. 25, the right and left meniscus surfaces are segments of a circular arc. If vertical ribbon were being grown, the ribbon edges would be defined by the dotted lines 410, moved closer together. In the case of the right hand meniscus surface of FIG. 24, the point of tangency to the ribbon surface is moved further out on the arc, from point 412 for vertical growth to point 414 for angled growth. In the case of the left hand meniscus surface, the point of tangency to the ribbon surface is closer to the melt. This is illustrated by the difference in position between point 416 for vertical growth and point 418 for angled growth. Thus, the right hand meniscus height, $M_R$, is increased over the corresponding height for vertical growth, while the left hand meniscus height, $M_L$ is decreased. The result is an enlarged growth interface and a large distance between interface edges as measured along the ribbon.

An important problem arises, however, with respect to this growth configuration. Up to this point, only the influence of geometrical constraints has been considered. Heat transfer and thermal constraints must be considered as well. Note, that the entire growth interface is by definition at the same temperature, the melting point of the material in question. This large isothermal surface imposes a severe restriction on the temperature of the surface of the ribbon near the interface as it must be at or near the melting point of the material over a large area.

Figure 26:
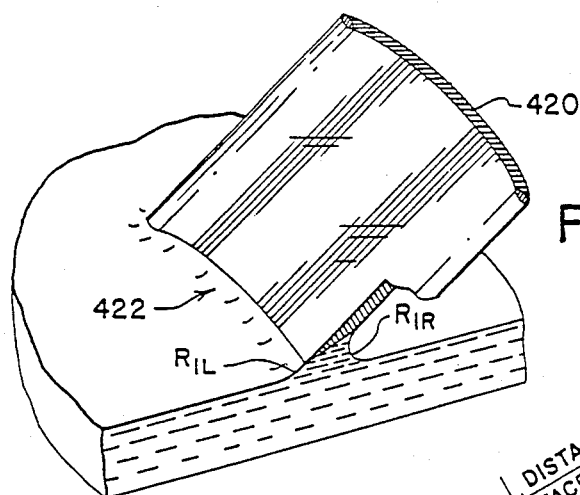
FIG. 26 is a diagrammatic illustration of the trough-shaped response of the ribbon to angled growth.

From FIG. 25 a specific distance between interface edges is defined for each angle of growth to the melt surface. However, the above discussion makes it clear that the thermal constraints will not necessarily be satisfied by this growth geometry. In general, the thermal constraints will favor a smaller distance between interface edges than that dictated by geometric constraints alone. However both geometric and thermal constraints must simultaneously be satisfied. In fact the ribbon responds by growing in a trough shaped manner as illustrated in FIG. 26.

The simultaneous satisfaction of both geometric and thermal constraints by trough shaped growth may be understood from the complete form of Laplace's equation, Eq. 5. Referring again to FIG. 26, the trough shaped ribbon 420, and consequently curved meniscus 422 gives rise to a finite curvature $R_2$ of the ribbon. This is in direct contrast to the growth of flat ribbon where $R_2 = $ infinity.

The radii of curvature $R_{1R}$ and $R_{1L}$ of the meniscus surfaces as measured in vertical cross-section is positive on both sides of the ribbon. That is, the meniscus surface is concave in a vertical section on both the left or upper, and right or lower, ribbon surfaces. However, $R_2$, the principal radius of curvature due to the ribbon troughing, is of opposite sign on the two sides of the ribbon. The left side is concave, having a positive curvature, while the right side is convex, having a negative curvature.

From Eq. 5, $(1/R_1 + 1/R_2)$ must remain unchanged for a given height h. On the left side of the ribbon, a finite and positive $R_2$ implies that $1/R_1$ must be smaller if the sum $(1/R_1 + 1/R_2)$ is to remain constant. Thus, $R_{1L}$ must take on a larger positive value than it had when $R_2$ was infinite in the flat ribbon case. On the right side, a finite and negative $R_2$ implies that $1/R_1$ must take on a larger value for the sum $(1/R_1 + 1/R_2)$ to remain constant. Thus $R_{1R}$ must take on a smaller positive value than it had when $R_2$ was infinite.

In summary, in the transition from growth of flat ribbon to growth of trough-shaped ribbon, the geometrical constraint of capillarity requires that on the upper surface the radius of curvature $R_1$ increase, while on the lower surface it must decrease.

Figure 27:
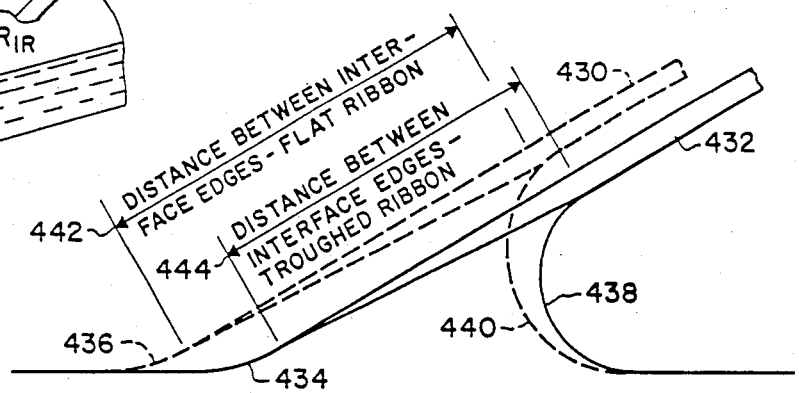
FIG. 27 is a diagrammatic illustration showing the effect on ribbon flatness due to changes in meniscus radii.

The effect of this change in radii may be seen from FIG. 27 which shows vertical cross-sections of angled growth through the middle of a ribbon 430 which is growing flat (dotted lines) and though the middle of a ribbon 432 growing in a trough shape. As illustrated, the trough-shaped ribbon exhibits a larger upper radius of curvature 434 than the flat ribbon curvature 436, and a smaller lower radius of curvature 438 than the flat ribbon curvature 440. The result is a decreased distance between interface edges as illustrated by arrows 442 and 444. Thus the growth of trough-shaped ribbon 432 is the natural response of the system in an effort to satisfy both geometric and thermal constraints.

FLAT RIBBON GROWTH

It has been found that by permitting the angular orientation of the meniscus surface at its lower attachment point to change from the normal tangential angle, e.g., tangential to the melt surface, the ribbon will grow flat.

Figure 28A:
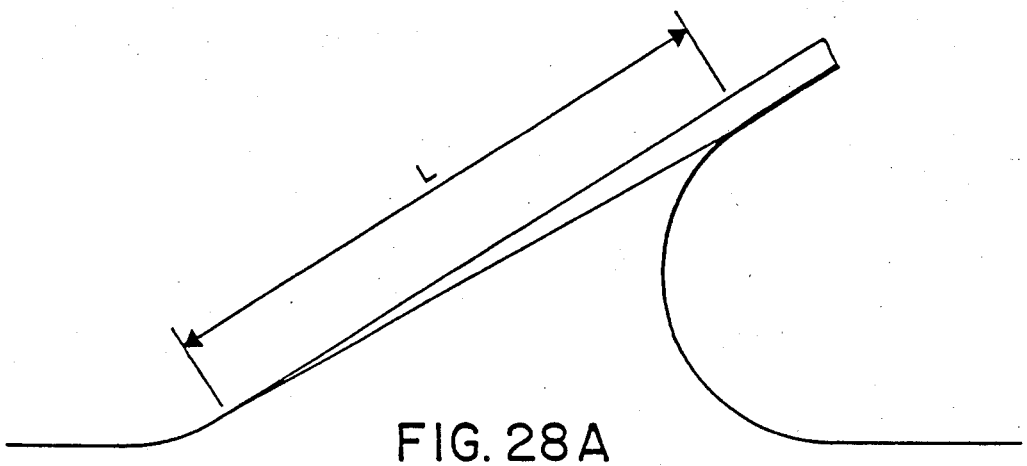
FIGS. 28A and 28B are diagrammatic illustrations showing the effect of interposing a stabilizing device in the melt to promote flat ribbon growth.
Figure 28B:
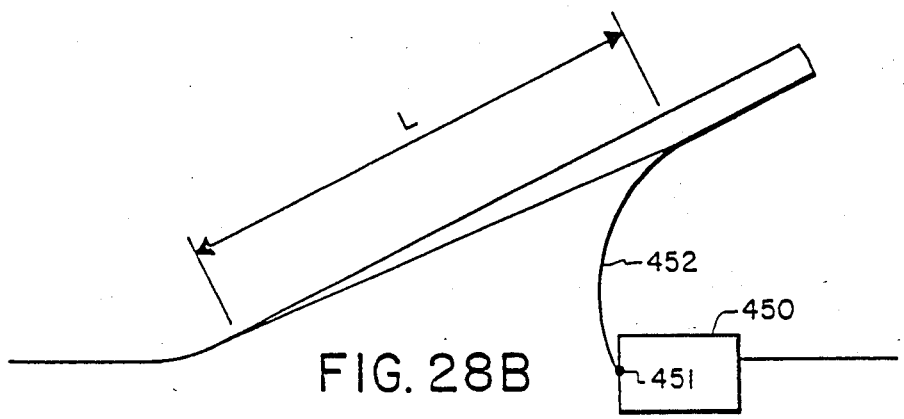

FIG. 28A is a vertical cross-section through a ribbon grown at an angle to the melt surface. In FIG. 28B, a device 450 has been inserted which allows for a wide range of meniscus attachment angles at lower attachment point 451 of meniscus surface 452. The result of the steep angle of attachment of the right side meniscus is a substantial reduction in the distance L between interface edges. This is the desired condition for flat ribbon growth and is achieved by relaxation of the constraint on the angle of lower meniscus attachment, which allows for flexibility in meeting the thermal constraints while growing flat ribbon. While flat ribbon growth is described for ribbons pulled at an angle, permitting variable attachment angles is useful to prevent bowing in the near vertical growth situation. The following sections deal in whole or in part with practical embodiments of device 450 of FIG. 28B.

WETTED STABILIZATION MEMBERS

Figure 29:
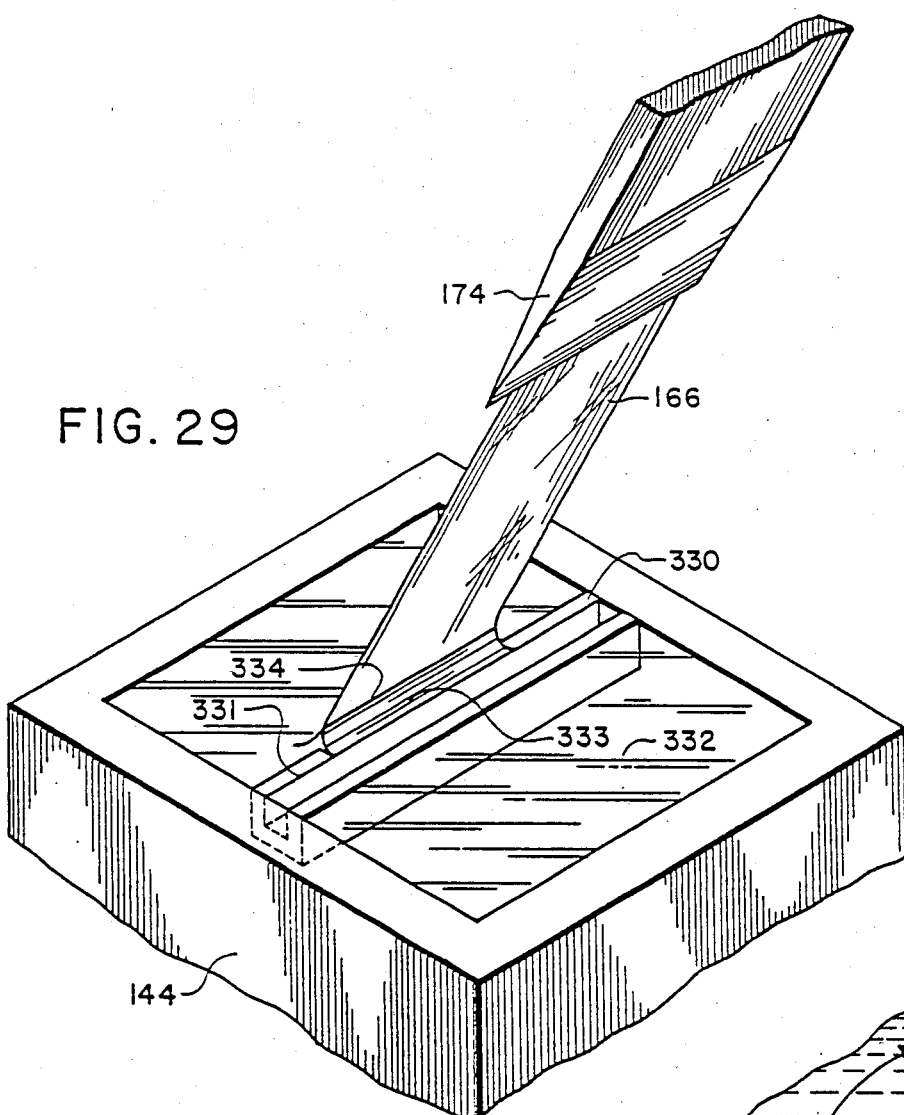
FIG. 29 is a diagrammatic illustration of a wetted stabilization member for preventing ribbon curvature or bowing during angled growth.

As discussed previously, angled growth may be stabilized by providing means which allow for a wide range of meniscus attachment angles. One means of providing for such a range of meniscus attachment angles is to use a wetted stabilization member or boat, illustrated at 330 in FIG. 29. Stabilization member 330 is carried in crucible 144 at the top surface of the melt, here illustrated by reference character 332. In the embodiment illustrated, boat 330 is U-shaped, with a straight edge 331 running in a horizontal plane parallel to the plane of ribbon 166. As can be seen, ribbon 166 is drawn at an angle to the vertical and a meniscus 333 is formed adjacent to edge 331. In FIG. 29, meniscus 333 attaches to edge 331 and to a line 334 on the ribbon at which the ribbon freezes.

It will be appreciated that in order for meniscus 333 to form with the appropriate curvature, there is finite spacing between the plane occupied by ribbon 166 and straight line 331. Boat 330 or similar structure is wetted by the melt and one of its functions is to assure that there is a region opposite the lower meniscus attachment point where there is no melt or liquid. In fact, the edge of the crucible can serve as a line of attachment.

Figure 30:
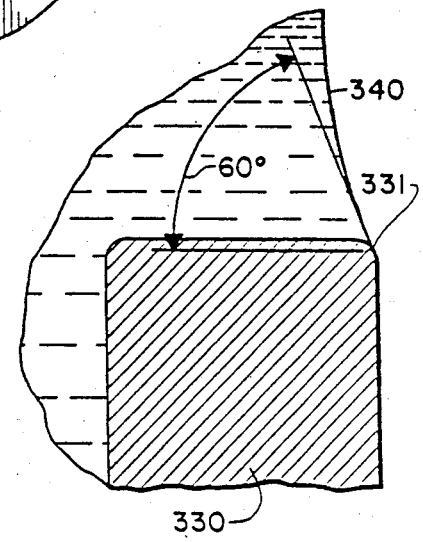
FIGS. 30A and 30B illustrate the attachment of the lower meniscus to the wetted stabilization member.
Figure 30:
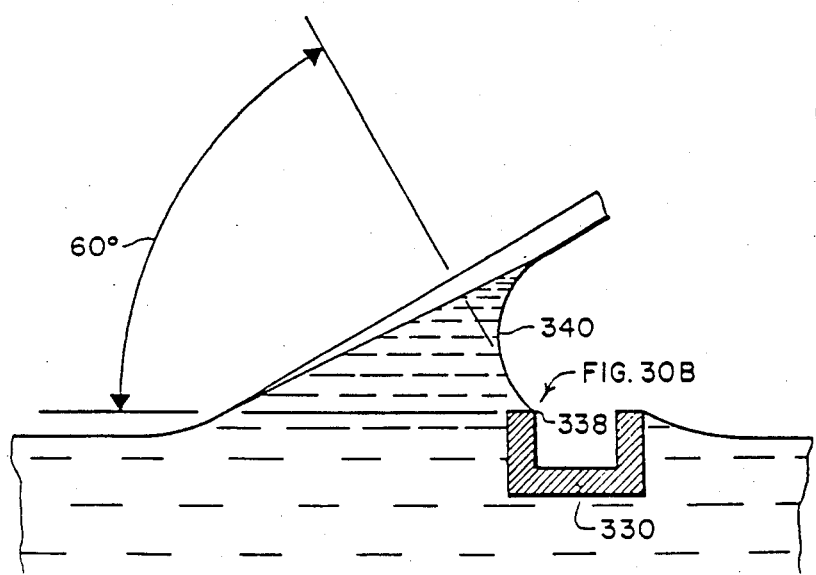

FIGS. 30A and 30B illustrate the operation of stabilization member 330. FIG. 30A is a vertical cross-section of the growing ribbon of FIG. 29, and FIG. 30B is an enlarged view of the indicated area of FIG. 30A.

As seen from FIG. 30A, at the point 338 of attachment of the lower side meniscus surface 340 to the stabilization member, the angle of surface 340 is approximately 60° with respect to the horizontal. This is in contrast to the case of growth directly from the free melt surface wherein this angle would be zero at the melt surface.

FIG. 30B illustrates one means by which the angle of the meniscus surface is allowed to vary with respect to the horizontal. As shown in this figure edge 331 of boat 330 is inherently slightly rounded. Any pair of materials such as a silicon melt and a graphite stabilization member determine an angle of attachment of the melt to the stabilization member, typically 30° for the materials mentioned. However, the angle of the meniscus surface with respect to the horizontal can be made to change because the meniscus is free to attach to the corner of the stabilization member anywhere along its curved edge. Thus the meniscus surface may attach to edge 331 over a range of angles.

ANGLED GROWTH WITH A VERTICALLY PULLED RIBBON

Figure 31:
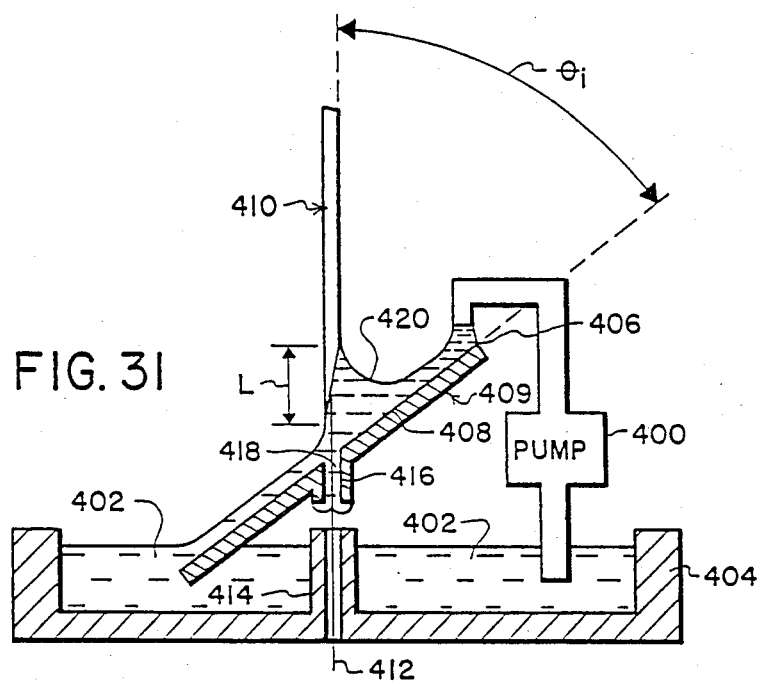
FIG. 31 is a cross-sectional and diagrammatic illustration of an inclined surface ribbon growth technique in which a separate inclined surface is used.

FIG. 31 presents an alternative embodiment for the growth of ribbon at an angle to the melt surface. In this embodiment a pump 400 raises molten material from melt 402 in a crucible 404 to the top 406 of surface 408 of inclined ramp 409. The molten material at 406 travels down surface 408, some of it crystallizing into a growing ribbon 410 and most of it returning to melt 402.

In this embodiment, each string 412 passes up through a corresponding integral standpipe 414 and then passes through a capillary retention tube 416 at aperture 418 in ramp 409, finally emerging through the flowing melt here illustrated at 420. It will be appreciated that the flow down the plane is maintained at a rate significantly higher than that required by the growing crystal, with the excess flow returning to the melt where it is recirculated through the system.

Growth from an inclined surface has several advantages over angled growth directly from the melt surface. First, excellent circulation of the melt exists under the growth interface because of the flowing melt. This results in effective removal of impurities rejected at the growth interface. Secondly, all the advantages of angled growth are combined with the manufacturing and handling convenience of a vertically pulled ribbon.

Figure 32:
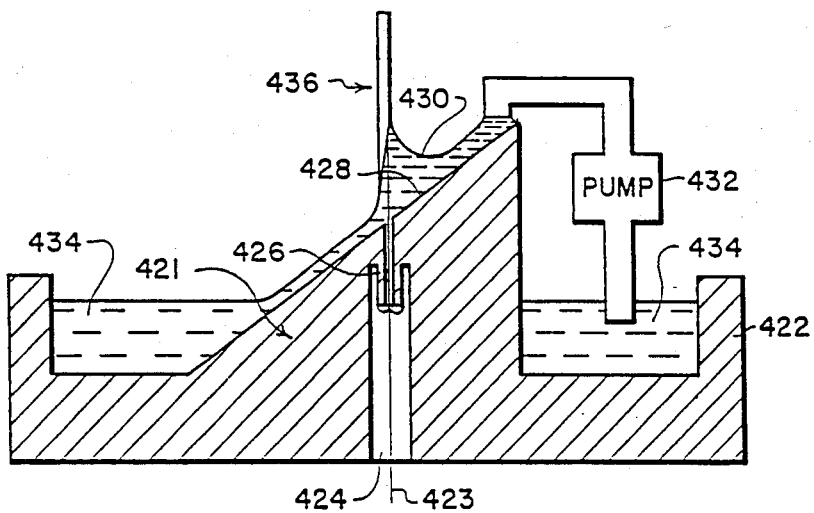
FIG. 32 is a cross-sectional and diagrammatic illustration of an inclined surface ribbon growth technique in which the inclined surface is an integral part of the crucible.

An alternative embodiment is shown in FIG. 32, in which a ramp 421 is formed integral to a crucible 422. In this configuration, string 423 enters through a deep counterbore 424 and then passes through a capillary retention tube 426, the interior of which communicates with the top surface 428 of ramp 421. The string then passes through flowing melt 430, pumped at 432 from melt 434, with ribbon 436 formed in a vertical direction as illustrated. This configuration offers the potential for enhanced mechanical stability and greater thermal uniformity as compared with the configuration of FIG. 31.

The flow down the inclined surface is primarily controlled by gravity and fluid viscosity. It should be noted that the surface of the liquid flowing down ramp 421 is a free surface, and hence is at the ambient pressure. In fact, in understanding the mechanics of growth of vertical ribbon fron an inclined surface, the inclined surface technique may be regarded as a variation on growth of ribbon at an angle to the melt. The situation is somewhat altered since the motion of the fluid down the ramp may have an effect on the growth and since the free melt surface is no longer perpendicular to the gravity vector. However, the fundamental qualitative arguments developed previously in reference to growth of ribbon at an angle to the melt surface apply to this growth configuration. Inspection of FIGS. 31 and 32 show that the ribbon is growing with an elongated interface, much as in FIG. 24. In fact, growth from an inclined surface may be viewed as roughly parallel to angled growth of ribbon from a horizontal melt surface, all rotated through an angle such that the ribbon is growing vertically, e.g., angle $\theta_i$ (FIG. 31)=$\theta_a$ (FIG. 24).

In the case of growth at an angle to the horizontal melt surface it was noted that often the ribbon will naturally grow in a trough shape. The solution to this problem illustrated schematically in FIG. 28B is to allow the angle of contact of the meniscus to the melt surface to assume a value other than tangential to the melt surface. Vertical growth of ribbon from an inclined surface will engender the same problem of ribbon troughing. The solution to the problem in this case follows the principle of FIG. 28B.

Figure 33:
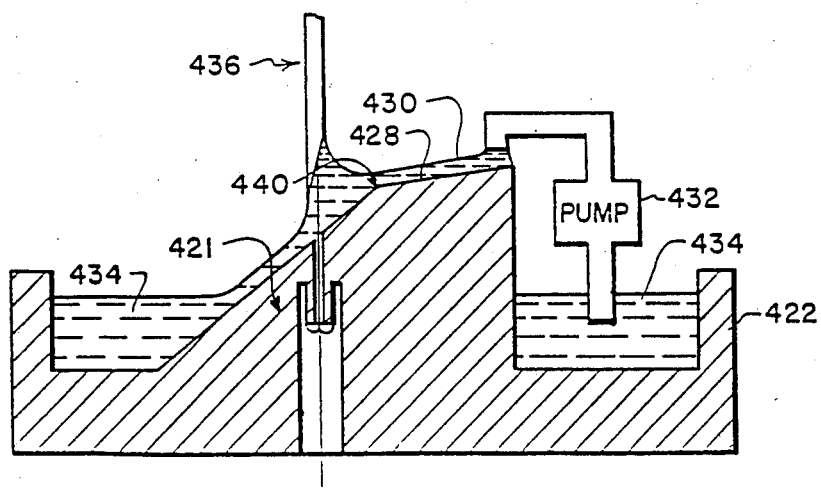
FIG. 33 is a cross-sectional and diagrammatic illustration of the inclined surface growth technique showing the use of a flow discontinuity to enable flat ribbon growth.

FIG. 33 presents a cross-sectional view of an embodiment of growth at an angle to the melt surface which allows for the growth of flat ribbon. In this embodiment ramp 421 is configured with an abrupt discontinuity at 440 in top surface 428 such that the inclination of the surface changes abruptly along a horizontal line parallel to the plane of ribbon 436. Over a large range of flow parameters, flow 430 will conform very closely to this discontinuity resulting in a sharp change of direction of the melt surface. As shown in detail in FIG. 34, a meniscus 442 may attach to melt surface 444 at any location around the corner formed at 440 by the flow discontinuity. Thus, while the meniscus surface must always meet the local melt surface tangentially, as it changes position around the corner formed by the flow discontinuity, the angle $\Delta$ of the meniscus surface at its point of attachment will change as measured with respect to a reference line such as horizontal 446. Thus, the flow discontinuity of FIG. 34 performs in much the same manner as the capillary stabilization boat of FIG. 29.

It will be appreciated that other geometries are possible which utilize a flow discontinuity to accomplish edge stabilization. The essential requirement is to create a free melt surface with an abrupt change of direction. FIG. 35 illustrates an embodiment where melt is pumped up a central flow channel 460 to the apex in a tent-shaped ramp 462 and then flows down the sloped sides of 464 and 466 of ramp 462. The abrupt change in flow direction in the region marked by reference character 468 acts to establish a range of attachment angles and allows for a larger change in the angle of the meniscus surface with respect to the horizontal than does the configuration of FIG. 33. Finally, if only a small allowable range of angular variation of the meniscus surface with respect to the horizontal is found to be sufficient to stabilize the growth, it may be effected by the configuration illustrated in FIG. 36. In this configuration, flow 470 conforms to a small hollow channel 472 machined into the top surface 474 of ramp 476, thus providing for a small range of angle selection by the meniscus surface at its point of attachment to the melt.

It will be appreciated that in certain flow configurations an upwardly projecting ridge can replace channel 472 of the FIG. 36 embodiment so as to provide a low discontinuity at which a range of attachment angles are possible.

In summary, in the inclined surface embodiments a flow discontinuity is provided for permitting a range of attachment angles so that flat ribbon may be grown. The flow discontinuity is established in a horizontal direction in a plane parallel to that of the growing ribbon and may be generated by various methods for producing corners, apexes, troughs and ridges.

All the configurations just described require a pump to raise the melt to the top of the ramp. As illustrated in FIG. 37, electromagnetic pumping may be utilized in which current is passed through a tube 500 in the direction shown by arrow 502. Here the tube is immersed in melt 504. A crossed magnetic field as illustrated by X's 506 causes a pumping action to result in pump flow 508 in the tube upon application of current.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. In a process in which a ribbon of crystal is grown from a body of melt at a growth interface, with string stabilization being employed at the edges of said ribbon, a method for minimizing the introduction of impurities from said melt to said crystal grown therefrom comprising: reducing build-up of impurities in the body of the melt due to impurity segregation at the growth interface during crystal growth by continually replenishing the melt with new raw material, and dumping and completely removing a fraction of molten material from said body of melt continually during the crystal growth process, said fraction being removed at a rate less than the rate of addition of new raw material such that the concentration of impurities in said body of melt and therefore in the growth crystal is reduced during crystal growth, in an open loop process.

2. The method of claim 1 wherein said dumping is accomplished by confining the melt to a crucible, providing the crucible with an outlet port from which melt is to flow, and providing an electromagnetically generated force on the melt at the output port which acts to counteract the flow at the outlet port.

3. The method of claim 1 wherein the melt is confined to a crucible, wherein the crucible is provided with an outlet port from which melt is to flow, and wherein means are provided to alternately freeze and thaw the material at the outlet port, thereby to control the dumping.

4. The method of claim 1 wherein said fraction of molten material dumped and removed from the melt is such that the mass of melt so removed per unit time is less than the mass of growing crystal per unit time.

5. A method for minimizing the introduction of impurities into a ribbon of crystalline material formed, with the aid of strings to stabilize the edges of said ribbon, in a crystal-growing process from a melt at a growth interface located at the melt surface, comprising the following steps:

maintaining a flow of melt in the vicinity of the growth interface, to disperse and remove from the growth interface impurities left at said interface during said crystal growing process;

dumping and discarding impurity-containing melt material continually from the body of said melt; and continually replenishing with fresh melt material the melt material removed from the body of the melt by said dumping step and by said crystal growing process;

said dumping and replenishing steps serving to continually reduce the concentration of impurities in said melt, reducing impurity build-up in the melt as a result of impurity segregation during crystal growth.

6. The method of claim 5 wherein the step of maintaining a flow of melt is accomplished by inducing electromagnetic forces in said melt.

7. The method of claim 5 wherein said dumping step is accomplished by confining said melt to a crucible, providing said crucible with an outlet port having its inlet below the level of said melt, and controlling the flow of melt material through said outlet port by inducing electromagnetic forces in the melt to counteract the gravitational force.

8. The method of claim 5 wherein said dumping step is accomplished by confining said melt to a crucible, providing said crucible with an outlet port having its inlet below the level of said melt, and controlling the flow of melt material through said outlet port by alternately freezing and thawing the material at the outlet port.

* * * * *

UNITED STATES PATENT AND TRADEMARK OFFICE
CERTIFICATE OF CORRECTION

PATENT NO. : 4,627,887

DATED : December 9, 1986

INVENTOR(S) : Emanuel M. Sachs

It is certified that error appears in the above-identified patent and that said Letters Patent is hereby corrected as shown below:

| | | |
|---|---|---|
| Column 1, | line 10, | "Growth." should read --Growth."-- |
| | line 52, | "prerferred" should read --preferred-- |
| | line 54, | "described" should read --describes-- |
| | line 57, | "materials" should read --material-- |
| Column 2, | line 35, | "adapted" should read --designed-- |
| Column 4, | line 29, | "tubes;" should read --tube;-- |
| | line 65, | "melt of" should read --method of-- |
| Column 5, | line 1, | "cross-sectionable" should read --cross-sectional-- |
| Column 6, | line 27, | "positions when" should read --positions where-- |
| Column 7, | lines 8-9, | "$R = \frac{\gamma}{pgh}$" should read --$R = \frac{\gamma}{\rho gh}$-- |
| Column 12, | line 29, | "peak 210" should read --pack 210-- |
| | line 37, | "speed" should read --spaced-- |
| Column 13, | line 25, | "Pedastal" should read --Pedestal-- |
| Column 15, | lines 36-37, | "$rH_{max} = \frac{2\gamma}{pg}$" should read --$rH_{max} = \frac{2\gamma}{\rho g}$-- |

UNITED STATES PATENT AND TRADEMARK OFFICE
CERTIFICATE OF CORRECTION

PATENT NO. : 4,627,887  Page 2 of 3
DATED : December 9, 1986
INVENTOR(S) : Emanuel M. Sachs It is certified that error appears in the above-identified patent and that said Letters Patent is hereby corrected as shown below:

Column 15, lines 40-41, "$H_{max} = \frac{2\gamma}{pgr}$" should read

-- $H_{max} = \frac{2\gamma}{\rho gr}$ -- lines 53-54, "$r \cdot H_{max} = \frac{2\gamma}{pg}$" should read

-- $r \cdot H_{max} = \frac{2\gamma}{\rho g}$ --

Column 16, line 58, "profile 310" should read --portion 310--

Column 17, line 9, "i.e." should read --i.e.,--
line 10, "capillary" should read --capillarity--
line 13, "capillary" should read --capillarity--
line 24, "Recepticle" should read --Receptacle--

Column 18, line 12, "SURFACE THEORETICAL" should read --SURFACE: THEORETICAL-- line 50, "angle $\phi$," should read --angle $\phi_0$,--

UNITED STATES PATENT AND TRADEMARK OFFICE
CERTIFICATE OF CORRECTION

PATENT NO. : 4,627,887
DATED : December 9, 1986
INVENTOR(S) : Emanuel M. Sachs

It is certified that error appears in the above-identified patent and that said Letters Patent is hereby corrected as shown below:

Column 20, line 66, "though" should read --through--

Column 22, line 54, "fron" should read --from--

Column 23, line 56, "a low" should read --a flow--

Signed and Sealed this

Twenty-fourth Day of May, 1988

Attest:

DONALD J. QUIGG

*Attesting Officer*   *Commissioner of Patents and Trademarks*